United States Patent
Carlisle, IV et al.

(10) Patent No.: US 12,423,503 B2
(45) Date of Patent: Sep. 23, 2025

(54) COMPUTER-IMPLEMENTED VERIFICATION OF A HARDWARE DESIGN IMPLEMENTATION AGAINST A NATURAL LANGUAGE DESCRIPTION OF THE HARDWARE DESIGN OR SOFTWARE CODE AGAINST A NATURAL LANGUAGE DESCRIPTION OF A SOFTWARE APPLICATION

(71) Applicant: Graf Research Corporation, Blacksburg, VA (US)

(72) Inventors: Edward Carlisle, IV, Atlanta, GA (US); Jonathan Graf, Blacksburg, VA (US); Scott Harper, Blacksburg, VA (US); Steven Frederiksen, Christiansburg, VA (US)

(73) Assignee: Graf Research Corporation, Blacksburg, VA (US)

( * ) Notice: Subject to any disclaimer, the term of this patent is extended or adjusted under 35 U.S.C. 154(b) by 626 days.

(21) Appl. No.: 17/850,275

(22) Filed: Jun. 27, 2022

(65) Prior Publication Data
US 2023/0148108 A1 May 11, 2023

Related U.S. Application Data

(60) Provisional application No. 63/277,716, filed on Nov. 10, 2021.

(51) Int. Cl.
*G06F 30/398* (2020.01)
*G06F 40/284* (2020.01)
*G06F 40/30* (2020.01)

(52) U.S. Cl.
CPC .......... *G06F 30/398* (2020.01); *G06F 40/284* (2020.01); *G06F 40/30* (2020.01)

(58) Field of Classification Search
CPC ...... G06F 30/398; G06F 40/284; G06F 40/30; G06F 8/10; G06F 11/3668; G06F 11/3684; G06F 11/3692
(Continued)

(56) References Cited

U.S. PATENT DOCUMENTS 10,843,080 B2  11/2020  Hsiao
10,902,132 B2   1/2021  Graf et al.
(Continued)

OTHER PUBLICATIONS

E. Carlisle IV et al., "DELV: Datasheet/English to Logic Verification" 2021 GOMAC Tech conference, Mar. 30, 2021, 6 pages.
(Continued)

*Primary Examiner* — Paul Dinh
(74) *Attorney, Agent, or Firm* — NIXON & VANDERHYE P.C.

(57) ABSTRACT

A computer system obtains and/or assists in creation of a natural language description file corresponding to a design, where the design is a hardware design or a software design and processes the natural language description file to extract semantic expressions. One or more intermediate representation data structures is generated from selected ones of the semantic expressions. Each intermediate representation data structure includes natural language design objects, natural language design object properties, and relationships between natural language design objects and/or natural language design object properties. The computer system transforms each intermediate representation data structure into one or more corresponding design verification statements derived from the natural language description file. Those design verification statements are subsequently evaluated against one or more design implementation files corresponding to the design.

52 Claims, 13 Drawing Sheets

(58) Field of Classification Search
USPC .......................................................... 716/102
See application file for complete search history.

(56) References Cited

U.S. PATENT DOCUMENTS

2017/0024311 A1* 1/2017 Andrejko ............ G06F 11/3668
2021/0117556 A1 4/2021 Graf et al.

OTHER PUBLICATIONS

S.J. Frederiksen et al, "Automated Assertion Generation from Natural Language Specifications" 2020 IEEE International Test Conference, Nov. 1-6, 2020, 5 pages.

* cited by examiner

Intermediate Results

| Natural Language to Logic Verification (NLLV) | |
|---|---|
| File Edit View Help | |
| Mapped Objects ▼ | Zoom In | Zoom Out | Page: 2 | | Q search | uart_top (uart_top.v) D50
▶ Ports D52
    wb_clk_i
    wb_rst_i
    wb_adr_i
    wb_sel_i
    wb_dat_i
    wb_dat_o
    wb_we_i
    wb_stb_i
    wb_cyc_i
    wb_ack_o
    int_o
    stx_pad_o
    srx_pad_i
    rts_pad_o
    dtr_pad_o
    cts_pad_i
    dsr_pad_i
    ri_pad_i
    dcd_pad_i
▲ Signals D54
  ⊞ wb_interface (uart_wb.v)

Row Text | Tables | Figures | Design Implementation | Bounded Sentences

---

Core Corporation    UART16550 Datasheet    10/11/2012

Section 2: IO Ports

2.1 WISHBONE interface signals

| Port | Width | Direction | Description |
|---|---|---|---|
| CLK | 1 | Input | Block's clock input |
| WB_RST_I | 1 | Input | Asynchronous Reset |
| WB_ADDR_I | 5 or 3 | Input | Used for register selection |
| WB_SEL_I | 4 | Input | Select signal |
| WB_DAT_I | 32 or 8 | Input | Data input |
| WB_DAT_O | 32 or 8 | Output | Data output |
| WB_WE_I | 1 | Input | Write or read cycle selection |
| WB_STB_I | 1 | Input | Specifies transfer cycle |
| WB_CYC_I | 1 | Input | A bus cycle is in progress |
| WB_ACK_O | 1 | Output | Acknowledge of a transfer |

D56
2.2 Other internal signals

| Port | Width | Direction | Description |
|---|---|---|---|
| INT_O | 1 | Output | Interrupt output |
| BAUD_O | 1 | Output | Optional baud rate output signal | www.corecorp.test    Rev 1.1    2 of 16

Ready

Natural Language Description Document

COMPUTER-IMPLEMENTED VERIFICATION OF A HARDWARE DESIGN IMPLEMENTATION AGAINST A NATURAL LANGUAGE DESCRIPTION OF THE HARDWARE DESIGN OR SOFTWARE CODE AGAINST A NATURAL LANGUAGE DESCRIPTION OF A SOFTWARE APPLICATION

CROSS REFERENCE(S) TO RELATED APPLICATION(S)

This application claims priority to U.S. provisional application 63/277,716, filed on Nov. 10, 2021, the contents of which are incorporated herein by reference.

STATEMENT REGARDING FEDERALLY SPONSORED RESEARCH OR DEVELOPMENT

This invention was made, in part, with Government support under contract FA8750-18-C-0115 awarded by U.S. Air Force. The Government has certain rights in the invention.

The technology in this patent application describes a computer system that performs design verification by electronically verifying a hardware design implementation against a natural language description of a hardware design and/or by electronically verifying a software design implementation, e.g., program code, against a natural language description of a software design like a software application.

An example hardware design implementation is a semiconductor intellectual property (IP) core or IP block. An IP core is a reusable unit of logic, cell, or integrated circuit layout design that is typically the intellectual property of one party, which can be licensed to another party or owned and used by a single party. In one example application, designers of application-specific integrated circuits (ASIC) and systems of field-programmable gate array (FPGA) logic can use IP cores as building blocks. Using an IP core or block in integrated circuit (IC) or chip design is comparable to using a library for computer programming or a discrete integrated circuit component for printed circuit board design. Each core or block is a reusable component of design logic with a defined interface and behavior for integration into a larger design.

IP cores are commonly offered as synthesizable register transfer language (RTL) in a hardware description language (HDL) such as Verilog or Very High-Speed Integrated Circuit (VHSIC) Hardware Description Language (VHDL). Hardware description languages are specialized computer languages used to describe the structure and behavior of electronic circuits, and most commonly, digital logic circuits. A hardware description language enables a precise, formal description of an electronic circuit that allows for the automated analysis and simulation of an electronic circuit. It also allows for the synthesis of an HDL description into a netlist (a specification of electronic components and how they are connected together), which can then be placed and routed to produce the set of masks used to create an integrated circuit. These languages are analogous to high level computer programming languages such as C. IP cores delivered to chip designers as RTL permit chip designers to modify designs at a functional level.

IP cores are also sometimes offered as generic gate-level netlists. In this context, the IP core netlist is a representation of the core's logical function implemented as generic gates or process-specific standard cells and the connectivity between these elements. An IP core implemented as generic gates can be compiled for any process technology. A netlist is analogous to an assembly code listing in computer programming. A netlist provides an IP core vendor with some protection against reverse engineering. Both netlist and synthesizable cores are sometimes called "soft cores" since both allow synthesis, placement, and routing (SPR) design flow.

Another example hardware design implementation is a collection of IP cores or other logic that is combined to perform some greater function. Like IP cores, this type of hardware design implementation can be in the form of synthesizable RTL in a HDL such as Verilog or VHDL or take the form of gate-level netlists.

In addition to synthesizable RTL and gate-level netlists, a hardware design implementation may also take the form of a binary GDSII database file. GDSII files contain planar geometric shapes, labels, and other layout information corresponding to the hardware design in a hierarchical form. GDSII files are used to create photo masks of the hardware design for a targeted process technology during the manufacturing of integrated circuits. GDSII files are analogous to compiled software executables that implement computer programs for a targeted processor architecture.

An example software design implementation is computer program code of a software application, where the software application is an example of a software design. Another example of a software design includes software libraries, which are reusable collections of computer program code that provide basic functionality, such as cryptographic functions. A software library may be delivered as source code or compiled executables that can be linked into another application. Similar to hardware IP cores, a software library is typically the intellectual property of one party, which can be licensed for use by one or more other parties.

A data sheet is a document that summarizes the performance and other characteristics of a device, where a device includes but is not limited to a product, machine, component (e.g., an electronic component), material, subsystem (e.g., a power supply), or software in sufficient detail that allows a customer to understand what the product is and a design engineer to understand the role of the component in the overall system. Typically, a datasheet is created by the manufacturer and begins with an introductory page describing the rest of the document, followed by listings of specific characteristics, with further information on the connectivity of the devices. Depending on the specific purpose, a datasheet may describe product operation, structure, or operating range.

Data sheets, specifications, requirements, end user documentation, and the like are examples of natural language description of hardware designs. Software specifications, requirements, architectural designs, Application Programming Interface (API) documentation, end user documentation, and the like are examples of natural language description of software designs, e.g., software applications.

There are multiple technical challenges with comprehensive design verification and design security. For example, it is difficult to examine and verify an implementation of an IP core and/or an implementation of a computer program, and it is also an expensive and time-consuming manual process with significant potential for error.

Accordingly, it will be appreciated that new and improved techniques, systems, and processes are continually sought after in these and other areas of technology to address these technical challenges.

Example embodiments of the design verification technology in this application electronically verify a design implementation against a natural language description of a hardware design and/or a software design implementation, e.g., program code, against a natural language description of a software design like a software application. In addition, design security problems are resolved by extracting verifiable properties directly from a datasheet or other natural language description document to reliably establish trust in the design under test while also not adding significant cost or delay to the design implementation process or requiring extensive verification or reverse engineering expertise.

The natural language description is processed using a computer system to generate verification statements separate from a design implementation corresponding to the natural language description (the design implementation typically does not include natural language). The computer system evaluates the verification statements against the design implementation to determine whether the verification statements are true or false. The computer system then reports whether the verification statements are satisfied by the design implementation.

In example embodiments, the computer system obtains a natural language description file corresponding to a design. The design is a hardware design or a software design. The computer system processes the natural language description file to extract semantic expressions and generates intermediate representation data structures from selected ones of the semantic expressions. Each intermediate representation data structure includes natural language design objects, natural language design object properties, and relationships between natural language design objects and/or natural language design object properties. The computer system transforms each intermediate representation data structure into corresponding design verification statements derived from the natural language description file for subsequent evaluation against design implementation files corresponding to the design.

Other example embodiments include a method comprising executing, by a processing system that includes at least one processor, instructions stored in memory to cause the processing system to: obtain a natural language description file corresponding to a design, where the design is a hardware design or a software design; process the natural language description file to extract semantic expressions; generate one or more intermediate representation data structures from selected ones of the semantic expressions, where each intermediate representation data structure includes natural language design objects, natural language design object properties, and relationships between natural language design objects and/or natural language design object properties; and transform each intermediate representation data structure into one or more corresponding design verification statements derived from the natural language description file for subsequent evaluation against one or more design implementation files corresponding to the design.

Other example embodiments include a non-transitory, computer-readable storage medium encoded with instructions that, when executed by at least one hardware processor, cause the at least one hardware processor to: obtain a natural language description file corresponding to a design, where the design is a hardware design or a software design; process the natural language description file to extract semantic expressions; generate one or more intermediate representation data structures from selected ones of the semantic expressions, where each intermediate representation data structure includes natural language design objects, natural language design object properties, and relationships between natural language design objects and/or natural language design object properties; and transform each intermediate representation data structure into one or more corresponding design verification statements derived from the natural language description file for subsequent evaluation against one or more design implementation files corresponding to the design.

Other example embodiments include a computer system providing a computer user interface that allows a user to create a natural language description file corresponding to a hardware design or a software design. The user-created natural language description file is processed by the computer system to extract semantic expressions as the user adds user-provided text to the natural language description file through the computer user interface. The computer system generates one or more intermediate representation data structures from selected ones of the semantic expressions, where each intermediate representation data structure includes natural language design objects, natural language design object properties, and relationships between natural language design objects and/or natural language design object properties, and then transforms each intermediate representation data structure into one or more corresponding design verification statements derived from the natural language description file for subsequent evaluation against one or more design implementation files corresponding to the design. One or more intermediate results from processing the natural language description file are displayed including: an intermediate representation of the natural language description file, one or more of the design verification statements, one or more of the natural language design objects. Moreover, human-readable messages are generated and displayed to assist the user in modifying the natural language description file.

This Summary is provided to introduce a selection of concepts that are further described below in the Detailed Description. This Summary is intended neither to identify key features or essential features of the claimed subject matter, nor to be used to limit the scope of the claimed subject matter; rather, this Summary is intended to provide an overview of the subject matter described in this document. Accordingly, it will be appreciated that the above-described features are merely examples, and that other features, aspects, and advantages of the subject matter described herein will become apparent from the following Detailed Description, Figures, and Claims.

These and other features and advantages will be better and more completely understood by referring to the following detailed description of example non-limiting illustrative embodiments in conjunction with the drawings of which:

FIG. 6 shows an example graphical user interface (GUI) with extracted text and a reconstructed hierarchy in accordance with example embodiments.

FIG. 7 shows an example GUI with table detection and translation in accordance with example embodiments.

FIG. 9 shows an example GUI with entities parsed from a design implementation in accordance with example embodiments.

FIG. 12 shows an example GUI with language engine results and verification results in accordance with example embodiments.

In this application, for purposes of explanation and non-limitation, specific details are set forth, such as particular nodes, functional entities, techniques, protocols, etc. in order to provide an understanding of the described technology. It will be apparent to one skilled in the art that other embodiments may be practiced apart from the specific details described below. In other instances, detailed descriptions of well-known methods, devices, techniques, etc. are omitted so as not to obscure the description with unnecessary detail.

Unless the context indicates otherwise, the terms circuitry and circuit refer to structures in which one or more electronic components have sufficient electrical connections to operate together or in a related manner. In some instances, an item of circuitry can include more than one circuit. An item of circuitry that includes one or more processors may sometimes be separated into hardware and software components. In this context, software refers to stored data that controls operation of the processor or that is accessed by the processor while operating, and hardware refers to components that store, transmit, and operate on the data. Circuitry can be described based on its operation or other characteristics. For example, circuitry that performs control operations may be referred to as control circuitry, and circuitry that performs processing operations may be referred to as processing circuitry.

In general, processors, circuitry, and other such items may be included in a system in which they are operated automatically or partially automatically. The term system refers to a combination of two or more parts or components that can perform an operation together. A system may be characterized by its operation.

Figure 13:
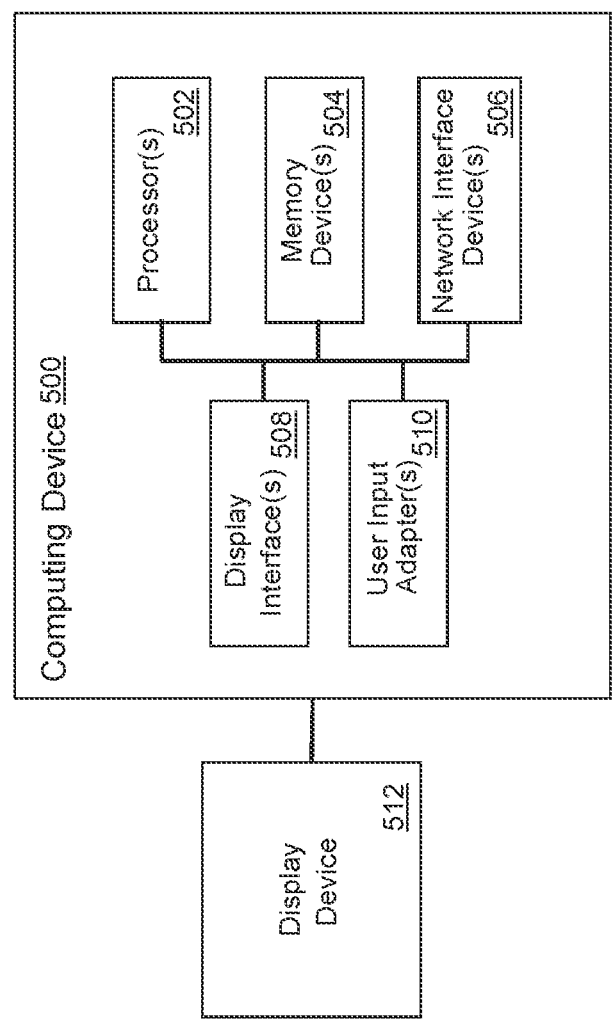
FIG. 13 shows an example computing system that may be used in some embodiments to implement the features shown in and described throughout this document, including those features shown in and described with reference to FIG. 1 through FIG. 12.

Computer-implemented function blocks, functions, and actions may be implemented using software modules. Function blocks, functions, and/or actions performed by software module(s) or processing node(s) are implemented by underlying hardware (such as at least one hardware processor and at least one memory device) according to program instructions specified by the software module(s). FIG. 13 and its description provide details of an example computer system with at least one hardware processor and at least one memory device. In addition, the described function blocks, functions, and actions may be implemented using various configurations of hardware (such as ASICs, PLAs, discrete logic circuits, etc.) alone or in combination with programmed computer(s). References to one of the function blocks, functions, and/or actions performing some action, operation, function, or the like, refers to the computer system 10 in FIG. 4 executing program instructions corresponding to the module to perform that action, operation, or function. Although the computer system 10 may be implemented using a single computing device like that in FIG. 13, the computer system 10 may also be implemented in a cloud-based computer environment and may be implemented across one or more physical computer nodes like the computing device as shown in FIG. 13. In certain examples, different aspects of the computer system 10 may be implemented on virtual machines implemented on corresponding physical computer hardware.

As mentioned, there are multiple technical challenges with comprehensive design verification and design security. For example, it is difficult to examine and verify an implementation of an IP core and/or an implementation of a computer program, and it is also an expensive and time-consuming manual process with significant potential for error.

Typically, hardware and software designs are verified by engineers manually developing test cases that are evaluated against the design. An IP core vendor or a software library vendor can also provide these test cases to a customer. Although "linting" techniques can check design implementations for common programming errors, these techniques do not verify design-specific implementation details. A further concern is test cases may expose trade secrets that the vendor wishes to keep confidential.

Verification of a hardware design implementation against a natural language description of the hardware design, such as a microelectronics specification and/or data sheet, and verification of a software code implementation against a natural language description of a software application, such as a specification or process flow, may include three main stages that are performed manually: vendor creation, verification preparation, and verification evaluation. In the vendor creation stage, a natural language description is created, and a design or code implementation is developed and distributed to one or more users. A user reads the natural language description and recognizes design or code objects from the design or code implementation to develop verification statements. The user evaluates the verification statements using a commercial design verification process, one example of which is OneSpin 360 DV-Verify. Performing these verification stages manually has many downsides including significant time and monetary costs as well as the need for skilled personnel.

One approach to these technical challenges is proof-carrying hardware and proof-based logic checking, where an IP core or software library customer uses a specification to describe the desired operation of the IP core logic along with a description of the security properties required for the design of that IP core logic. An IP core vendor can satisfy these specifications by producing HDL code for the IP core and a proof in a format that can be independently used by the IP customer to prove that the HDL code meets the customer's desired security properties. A major drawback with this approach is that it requires the IP core vendor to produce, in addition to the HDL code, a complex logical description of the security properties of the IP core in a language that is not easily understood by either the vendor or the customer.

These and other technical problems are resolved by the design verification technology described in this application which electronically verifies a design implementation against a natural language description of a hardware design and/or a software design implementation, e.g., program code, against a natural language description of a software design like a software application. Design security problems are resolved by extracting verifiable properties directly from a datasheet or other natural language description document to reliably establish trust in the design under test while also not adding significant cost or delay to the design implementation process or requiring extensive verification or reverse engineering expertise.

A natural language description is processed using a computer system to generate verification statements separate from a design implementation corresponding to the natural language description (the design implementation typically does not include natural language). The computer system evaluates the verification statements against the design implementation to determine whether the verification statements are true or false. For example, a verification statement may assert that signal A goes high five clock cycles after signal B goes high. The computer system evaluates this verification statement against the design implementation to determine if signal A does indeed go high five clock cycles after signal B goes high in the design implementation. The computer system then reports whether the asserted verification statement is satisfied by the design implementation.

In certain example embodiments, the computer system obtains a natural language description file corresponding to a design. The design is a hardware design or a software design. The computer system processes the natural language description file to extract semantic expressions and generates intermediate representation data structures from selected ones of the semantic expressions. Each intermediate representation data structure includes natural language design objects, natural language design object properties, and relationships between natural language design objects and/or natural language design object properties. The computer system transforms each intermediate representation data structure into corresponding design verification statements derived from the natural language description file for subsequent evaluation against design implementation files corresponding to the design.

In certain example embodiments, the computer system obtains and processes design implementation files corresponding to the design to determine design implementation objects included in the design implementation files. The design implementation files are distinct from the natural language description file, and the design implementation objects are distinct from the natural language design objects. The computer system creates a mapping for each of the natural language design objects to a corresponding one of the design implementation objects. Based on the mappings, the computer system replaces the natural language design objects in the design verification statements derived from the natural language description file with the corresponding mapped design implementation objects to produce modified verification statements derived from the natural language description file. The subsequent evaluation includes evaluating the modified verification statements derived from the natural language description file against the one or more design implementation files.

Examples of the natural language description file include a hardware design description such as a datasheet, a specification document, a requirements document, and/or user provided text along with a software design description such as software documentation, a specification document, a requirements document, or user provided text.

In certain example embodiments, the computer system extracts raw text from the natural language description file and determines boundaries of sentences in the raw text to produce bounded sentences. The computer system converts each of multiple words in each bounded sentence into a corresponding word identifier using a first mapping, groups a plurality of word identifiers into a corresponding token using a second mapping, and groups a plurality of tokens into a corresponding frame by identifying predetermined frame patterns using a third mapping. Semantic expressions are formed from sets of frames.

In certain example embodiments, the computer system extracts positional information from the natural language description file and processes extracted raw text and/or extracted positional information to reconstruct layout information pertaining to a hierarchical structure of the natural language description file. The computer system processes reconstructed layout information to generate one or more of the following: table information, figure information, header information, footer information, sentences, and paragraphs. Table information may be translated into sentences, and the figure information may be image processed to generate verification statements derived from the figure information.

In certain example embodiments, the computer system recognizes natural language design objects in the bounded sentences corresponding to predetermined names and replaces each recognized natural language design object with a corresponding predetermined name. An abbreviated name and/or variations of a name in the bounded sentences may be converted to a same corresponding predetermined name. Predetermined expressions detected in the bounded sentences may be converted into standardized expressions. Bounded sentences without verifiable properties can be identified and removed.

In certain example embodiments, the computer system generates an intermediate representation model of the natural language description file that is iteratively constructed as each bounded sentence is processed. The computer system uses the intermediate representation model to resolve ambiguities in each bounded sentence and to infer relationships of the design not stated in the natural language description file.

In certain example embodiments, the computer system displays one or more intermediate results from processing the natural language description file including: an intermediate representation of the natural language description file, the verification statements, the natural language design objects, mappings between natural language design objects and design implementation objects, removed bounded sentences, or table information translated into sentences. The computer system generates human-readable messages to assist a user in modifying the natural language description file. After a user modifies the natural language description file, the computer system re-processes modified bounded sentences or re-translates table information into sentences and allows a user to modify the mappings between natural language design objects and design implementation objects.

In certain example embodiments, the computer system verifies that the design implementation file satisfies the verification statements using a computer-implemented design implementation verification process and generates a design implementation verification output for display and/or storage in memory.

Figure 1:
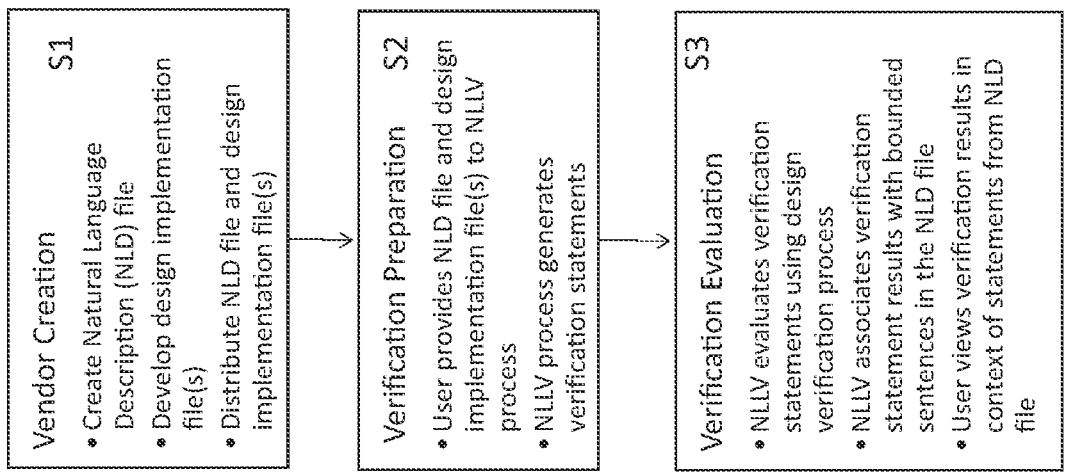
FIG. 1 shows an example processing flow for automated natural language to logic verification (NLLV) in accordance with example embodiments.

FIG. 1 shows an example processing flow for computer-implemented natural language to logic verification (NLLV) in accordance with example embodiments. Stage S1 illustrates the vendor creation stage described above where a vendor or other entity creates a natural language description file of a hardware or software design, develops design implementation file(s) of the hardware or software design, and distributes the natural language description file and the design implementation file(s) to one or more users. In stage S2 corresponding to the verification preparation stage, the computer-implemented natural language to logic verification (NLLV) process receives or otherwise obtains the natural language description file and the design implementation file(s) of the hardware or software design and performs operations (described in detail below) to generate corresponding verification statements. Stage S3 is the verification evaluation stage where the NLLV process evaluates the verification statements using a design verification process to generate verification statement results, associates the verification statement results with bounded sentences in the natural language description, and generates a graphical user interface output that allows a user to view verification results in the context of statements from the original natural language description file.

Figure 2:
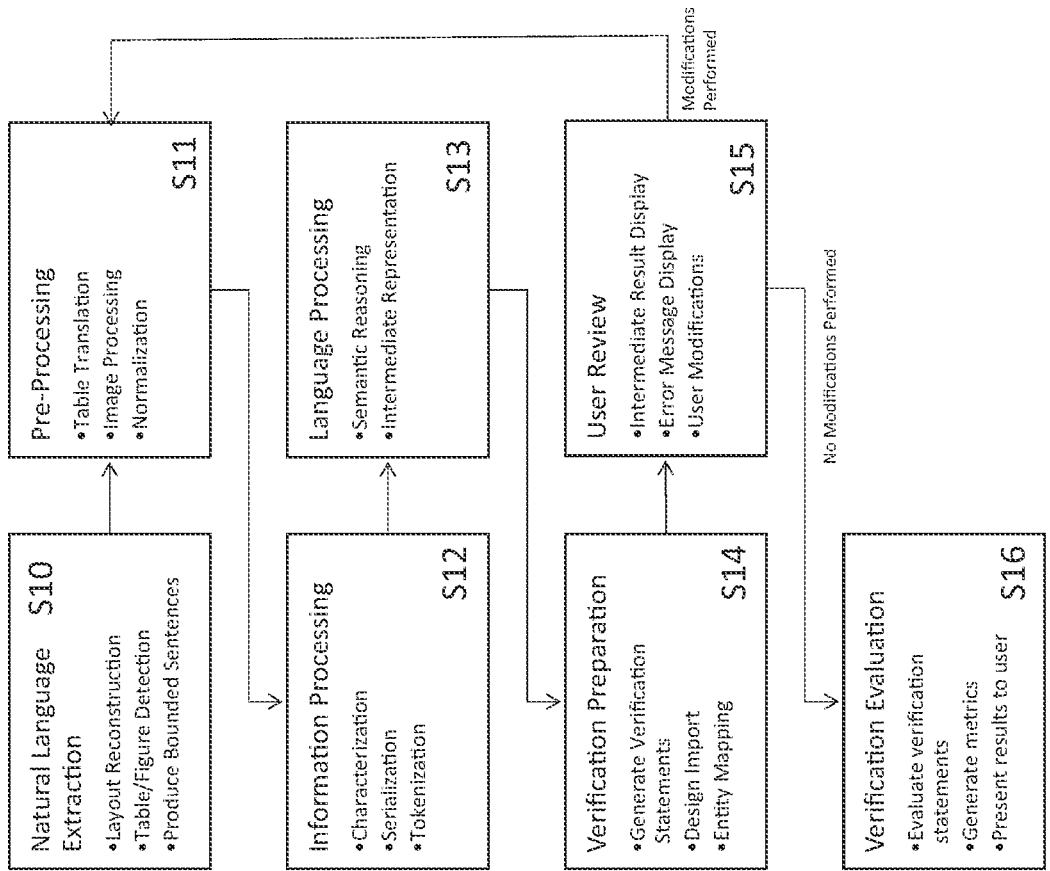
FIG. 2 is a flowchart showing computer-implemented steps for performing an NLLV process in accordance with example embodiments.

FIG. 2 is a flowchart showing computer-implemented steps for an NLLV process in accordance with example embodiments. At the outset, it is important to understand that these steps are mainly performed on a natural language description file. The corresponding design implementation file, which does not contain natural language text but rather an implementation language (like Verilog) and is stored in, e.g., a plain text file, is processed later in the process at step S14 in FIG. 2 using a parser in a verification preparation module 22 described in conjunction with FIG. 4 that understands the implementation language, e.g., Verilog. The parser extracts design implementation objects, which are imported at step S14 in FIG. 2, to evaluate against the verification statements in step S16 in FIG. 2.

Step S10 performs natural language extraction operations on a natural language description (NLD) file typically corresponding to a document file. A document file includes any electronic file in any computer-readable format, such as PDF, PDF/A, RTF, DXF, EPS, CGM, SHP, BMP, TIFF, JPEG, GIF, PNG, plain text files, database files, spreadsheet files, markup language files like HTML, etc. The natural language extraction operations include layout reconstruction, table/figure detection, and generation of bounded sentences. Some formats (e.g., PDF) do not impose much structure to the raw data contained in a document; therefore, simply extracting the raw text may result in characters that are scrambled together and unintelligible. However, using positional information for each character (the x and y coordinates of the page where the character should be rendered) allows for the layout of the raw text to be reconstructed. As each character is extracted, it is sorted based on its x and y coordinates and characters sharing the same y coordinate can be grouped together into lines of text. Nearby lines of text can then be grouped into a paragraph. Additionally, the size of characters can be used to infer section headers, and the paragraphs between section headers can be understood to be related to the preceding section header. An example of layout reconstruction is described below in conjunction with FIG. 6.

Once all of the text in the NLD file is extracted in the order a reader would have understood by observing the rendered document, the boundaries of sentences (e.g., noted with a period) are determined to produce bounded sentences for the NLD file. A bounded sentence example is described in conjunction with Table 3 provided below.

Any figures in the NLD file are detected by analyzing the portions of the NLD file that are not associated with text. In the PDF format, for example, these portions include instructions for drawing lines and other shapes. Grouping together shapes that are drawn in proximity to each other allows a determination of the areas of a page that contain figures. An example of figure detection is described below in conjunction with FIG. 8. Tables are detected as a subset of figures, where the shapes contained generally only include horizontal and vertical lines. The horizontal and vertical lines that make up the table cell boundaries are used to partition the text within a table. An example of table detection is described below in conjunction with FIG. 7.

Step S11 performs pre-processing operations on the output generated from step S10. These operations include table translation, image processing, and normalization with respect to the NLD file. Initially, the contents of any table in the NLD file are preferably translated into sentences. The output from the table detection provides a table data structure that can be used to extract the text of each table cell along with the row and column indices of each table cell. This enables tables to be classified into various categories, where each category may define a specific template to be used when translating the tables. As an example, a table that includes both row and column headers can be translated as "<row header> <column header> is <cell contents>." This translation template may be used for tables that define the ports of an IP core, where the row header is the name of the port, and the column header is the name of a property, resulting in the following example sentence for such a table cell: "Clock direction is input." Other examples of sentences translated from table contents are described below in conjunction with FIG. 7.

For figures in the NLD file that are not tables, image processing may be used to extract verifiable properties. For example, to extract the properties of a state-machine diagram, image processing techniques can be used to extract the state names and transitions in the diagram. Structural diagrams may be used to extract the connections between blocks in the state-machine diagram to help perform mapping. Transition diagrams may be used to generate verification statements represented by the values and timings of signals in the diagrams. Examples of verification statements generated from figures are described below in conjunction with FIG. 8.

Normalization is performed to resolve ambiguity by replacing indirect references to design objects with the direct name of the object. An indirect reference to a design object may include pronouns such as "it" or common nouns such as "the register." Occurrences of indirect references are replaced with the direct name of the object they refer to, for example, "the modem status register." Another form of normalization is performed to reduce complexity by ensuring phrases that may have multiple valid forms are replaced with a single form for consistency. For example, a sentence that describes an action performed on multiple design objects may state this in one of two ways, either "Register A, Register B, and Register C are all reset." or "Register A is reset, Register B is reset, and Register C is reset." While both of these statements are valid and state the same information, occurrences of statements of the first form would be translated to the second form so that all statements of this type use the same phrasing. Other examples of sentence normalization are provided below in Table 1.

TABLE 1

Sentence normalization examples

| Normalization Type | Original Sentence | Normalized Sentence |
|---|---|---|
| Redundancy | In other words, if the data has an even number of '1's' in it, then the parity bit is '1'. | In other words, if the data has an even number of '1's', then the parity bit is '1'. |
| "Both" | Both the transmitter FIFO and transmitter shift register are empty. | The transmitter FIFO is empty and the transmitter shift register is empty. |
| "All" | Register A, B, and C are all reset. | Register A is reset, register B is reset, and register C is reset. |
| "Either" | Either the transmitter FIFO or transmitter shift register are empty. | The transmitter FIFO is empty or the transmitter shift register is empty. |
| "If . . . , then . . ." | Bit 0 indicates that an interrupt is pending when it's logic '0'. | If bit 0 is logic '0', then bit 0 indicates that an interrupt is pending. |

Information processing operations at step S12 performed on the output generated from step S11 include characterization, serialization, and tokenization. During characterization, the contents of the natural language description are classified to determine what information can be used to generate verification statements. This is an important step since there will be many statements in a natural language description that do not contain verifiable properties and should be ignored. There are many techniques that can be used to classify the natural language contents, including for example machine learning or pattern recognition techniques. For machine learning techniques, a representative set of natural language descriptions can be manually classified and used to train a machine learning model that can be used to perform classification. Alternatively, pattern recognition may be used to target phrases that are common in sentences describing verifiable properties. Examples of characterized sentences are provided below in Table 2.

TABLE 2

Sentence characterization examples

| Verifiable Sentences | Ignored Sentences |
|---|---|
| This bit is cleared when the status register is read. | Data width, color channels and maximum video resolution can be configured at compile time. |
| The signal should be asserted until CFG is asserted. | The block diagram of the core is on the following page. |
| The divisor latches can be accessed when the 7th bit of the Line Control Register is set to '1'. | More demanding video applications, like streaming video or video games, can benefit from the video-bank-switching function. |

Serialization transforms each word in the natural language description into corresponding word identifiers. These word identifiers are numeric values that facilitate processing and include embedded metadata such as grammar properties like part-of-speech, lemma, or conjugation of a word. A serialization example is described below in conjunction with FIG. 10 and Table 3.

Tokenization groups the words of a sentence into tokens, where a token is one or more words. Multi-word tokens, referred to as collocations, are groups of words that convey a single object or action, such as an operator (e.g., greater than or equal to). Tokens are represented by an identifier, and an externally defined mapping is used to define sequences of word identifiers that map to token identifiers. There may be multiple mappings of word identifier sequences that map to the same token identifier, resulting in additional normalization. U.S. Pat. No. 10,843,080 B2 describes another technique for tokenization that also includes support for handling new words and phrases that do not exist in the externally defined mapping. The contents of U.S. Pat. No. 10,843,080 B2 are incorporated herein by reference. A tokenization example is described below in conjunction with FIG. 10 and Table 3.

Step S13 performs language processing on the output information generated from step S12 and includes semantic reasoning and intermediate representation operations. Semantic reasoning begins by grouping sequences of tokens into semantic frames using an external mapping similar to the process of grouping words into tokens. Semantic frames create templates for semantic operators and include slots to be filled by specific types of tokens determined by the mapping. The NLLV process creates semantic frames that fall into one of the following categories: antecedents, consequents, and modifiers. Semantic expressions capture the meaning of a sentence and are constructed by collecting the semantic frames of a sentence into groups of antecedents, consequents, and modifiers. The constructed semantic expressions provide a uniform way of querying the relationships and information contained in the semantic frames found in a sentence and allow the meaning of the sentence to be interpreted. A semantic reasoning example is described below in conjunction with FIG. 10 and Table 3.

An intermediate representation (IR) data structure may for example be generated by processing the semantic expressions of a bounded sentence and using the context information and ordering of the frames. The intermediate representation conforms to a human-readable grammar (a system and structure of a language or of languages, usually including syntax and semantics) that encapsulates conditions, statements, properties, descriptions, value assignments, temporal relationships, and compound operators. There are three main components to intermediate representation (IR) processing: antecedent processing, consequent processing, and modifier/operator processing. In the general case, the antecedent and consequent frames are processed separately, and their results are combined afterwards. Modifier frames are associated with the frame that precedes them in the sentence. Modifier frames allow the NLLV process to handle complex patterns, and function as operators that accept other frames as arguments. The context of the operator (e.g., the surrounding frames, operator type, etc.) defines how it is interpreted and which type of intermediate representation will be generated. In this way, the events (e.g., "set", "reset", etc.) are abstracted away from the relationships between the events until they are required for intermediate representation generation, which allows for more flexible orderings as well as future extensions via new modifiers, antecedents, and consequents. An intermediate representation example is described below in conjunction with FIG. 5, FIG. 10, and Table 3.

Verification preparation operations at step S14 include generating verification statements based on the output generated from step S13. Step S14 also imports the design implementation file(s) corresponding to the natural language description file and performs entity mapping between objects in the natural language description file and the corresponding design implementation file(s). To generate verification statements, the intermediate representation data structures are categorized into classes. Each class of intermediate representation has a corresponding translation to a verification statement template. Placeholders in the template are populated using the properties contained in the intermediate representation data structure. This initial set of verification statements references the names of design objects as featured in the natural language description and requires mapping of those objects to the design implementation objects before an evaluation can be performed.

Next, the design implementation files are received and processed to extract all the design objects they contain. The design objects extracted from the design implementation can then be mapped to the corresponding design objects contained in the natural language description and, consequently, the verification statements. Mapping can be performed manually by the user or by an automated process, for example approximate string-matching techniques can be used to automatically map a design implementation object to its corresponding natural language description object when the edit distance between the names of the objects is below a threshold. After the mapping of natural language description design objects to design implementation objects is established, the natural language description objects in the verification statements are replaced with the corresponding design implementation objects. An example of generating verification statements is described below in conjunction with FIG. 10 and Table 3. An example of importing design implementation file(s) and entity mapping is described below in conjunction with FIG. 9.

Review of the verification statements by a user is conducted at step S15 using an intermediate result display, and if errors are detected, error messages are generated and displayed. At this optional step, a user can view the verification statements that were generated for correctness. Additionally, sentences that were unsuccessfully processed (i.e., generated an error during processing) can be reviewed by the user as well. After reviewing the information provided, the user may determine if modifications are necessary. Examples of an intermediate result display and a generated error message are described below in conjunction with FIG. 10 and FIG. 11.

If user modifications are desirable, e.g., to address the content of an error message, then a user may rephrase natural language text extracted from the document to address the feedback included in any error messages to more clearly state the intent of the natural language text. Any rephrased text is re-processed by returning control to the pre-processing step S11 to repeat steps S11-S15 after the modifications are performed. If no modifications are performed, then verification evaluation occurs at step S16, where verification statements are evaluated and the results presented to one or more users.

To perform verification evaluation, the design implementation files and verification statements are provided as input to another computer application that evaluates the verification statements against the design implementation. The output of that application is parsed to determine the status of each verification statement and these verification results are stored in the data store 12. The user interface 30 then prepares the verification results for display to the user. The verification results can be shown in the context of the verification statements (as is typical for design verification) and also in context of the natural language statements that were used to generate the verification statements. Examples of verification statements, evaluating verification statements, and presenting results are described below in conjunction with FIG. 12.

Table 3 provides an example of text from a natural language description document translated to verification statements targeting a hardware design implementation, including intermediate results. The first row of the table shows the raw text. The second row shows the bounded sentences segmented from the raw text. The third row shows the word identifiers extracted from the bounded sentences as a numeric identifier and the corresponding word surrounded by square brackets. The fourth row shows the tokens assembled from the word identifiers as a numeric identifier and the corresponding words surrounded by curly brackets. The fifth row shows the semantic frames assembled from the tokens as words encapsulated in parentheses. The sixth row shows the semantic expressions as semantic frames grouped into antecedents and consequents. The seventh row shows the intermediate representation generated from the semantic expressions. The eighth row shows the verification statements generated from the intermediate representation. The verification statements in this example target the System Verilog Assertion (SVA) syntax for evaluation against a hardware design implementation.

TABLE 3

Example of raw text processing to verification statements, including intermediate results

| | | | |
|---|---|---|---|
| 1 | Raw Text | Writing a '1' to FCR[1 ] resets the Receiver FIFO. Writing a '1' to FCR[2] resets the Transmitter FIFO. | |
| 2 | Bounded Sentences | Writing a '1' to FCR[1] resets the Receiver FIFO. | Writing a '1' to FCR[2] resets the Transmitter FIFO. |
| 3 | Word Identifiers | [7 write] [16 a] [11'] [2 1] [12'] [4 to] [1747 fcr] [167 [ ] [2 1] [168] ] [5 reset] [1 the] [54 receiver] [58 fifo] [127.] | [7 write] [16 a] [11'] [2 1] [12'] [4 to] [1747 fcr] [167 [ ] [11 2] [168] ] [5 reset] [1 the] [15 transmitter] [58 fifo] [127.] |
| 4 | Tokens | {59 write} {-21 1} {13 to} {-21 fcr[1]} {61 reset} {-21 receiver fifo} {66.} | {59 write} {-21 1} {13 to} {-21 fcr[2]} {61 reset} {-21 transmitter fifo} {66.} |
| 5 | Semantic Frames | (write 1 to fcr[1]) (reset receiver fifo) | (write 1 to fcr[2]) (reset transmitter fifo) |
| 6 | Semantic Expressions | Antecedent: (write 1 to fcr[1]) Consequent: (reset receiver fifo) | Antecedent: (write 1 to fcr[2]) Consequent: (reset transmitter fifo) |
| 7 | Intermediate Representation | STATE(write, FCR[1], 1) -> STATE(reset, receiver.fifo) | STATE(write, FCR[2], 1) -> STATE(reset, transmitter.fifo) |
| 8 | Verification Statements | FCR[1] \|=> receiver.fifo.reset == 1 | FCR[2] \|=> transmitter.fifo.reset == 1 |

Table 4 provides an example of text from a natural language description document translated to a verification statement targeting a software design implementation. The first row of the table shows the raw text. The second row shows the bounded sentence segmented from the raw text. The third row shows the word identifiers extracted from the bounded sentence as a numeric identifier and the corresponding word surrounded by square brackets. The fourth row shows the tokens assembled from the word identifiers as a numeric identifier and the corresponding words surrounded by curly brackets. The fifth row shows the semantic frames assembled from the tokens as words encapsulated in parentheses. The sixth row shows the semantic expressions as semantic frames grouped into antecedents and consequents. The seventh row shows the intermediate representation generated from the semantic expressions. The eighth row shows the verification statements generated from the intermediate representation. The verification statement in this example targets the Linear Temporal Logic (LTL) syntax for evaluation against a software design implementation.

existing natural language description file. At step S20, a user begins creating a new natural language description file and optionally imports the design implementation files that embody the design that will be described in the description file being created. Next, at step S21, a user begins adding content to the file, including text, tables, and/or figures. As a user adds each new item of content it will be extracted in a manner similar to step S10 of FIG. 2. Processing of the extracted content continues in steps S22 through S25 in the same manner as described for steps S11 through S14 in FIG. 2. Step S26 is only performed if the user imported the design implementation files at step S20. If step S26 is performed, then verification evaluation is performed as described previously for step S16 of FIG. 2.

At step S27, the computer generates and provides feedback to a user in a manner similar to step S15 of FIG. 2. The feedback may include, for example, display of intermediate results, verification results, and/or error messages. At this point, a user may decide to revise previously-added content

TABLE 4

Example of raw text processing to verification statement for a software system

| | | |
|---|---|---|
| 1 | Raw Text | If a tractor has a speed of 60 mph and the tractor is loaded-to-GVWR and the tractor has 4 axles and the tractor has a GVWR of at least 70,000 pounds then the tractor stops in at most 310 feet. |
| 2 | Bounded Sentence | If a tractor has a speed of 60 mph and the tractor is loaded-to-GVWR and the tractor has 4 axles and the tractor has a GVWR of at least 70,000 pounds then the tractor stops in at most 310 feet. |
| 3 | Word Identifiers | [34 if] [16 a] [234 tractor] [63 has] [16 a] [943 speed] [67 of] [79 60] [901 mph] [22 and] [11 the] [234 tractor] [87 is] [827 load] [678 —] [62 to] [678 —] [6729 GVWR] [22 and] [11 the] [234 tractor] [63 has] [33 4] [641 axle] [22 and] [11 the] [234 tractor] [63 has] [16 a] [6729 GVWR] [21 of] [52 at] [45 least] [3458 70,000] [2384 pound] [80 then] [11 the] [234 tractor] [3287 stop] [90 in] [101 at] [2819 most] [2290 310] [3682 feet] [127.] |
| 4 | Tokens | {12 if} {328 tractor} {99 has} {329 speed} {221 of} {-21 60 mph} {22 and} {328 tractor} {90 is} {982 load-to-gvwr} {22 and} {328 tractor} {99 has} {-21 4 axles} {22 and} {328 tractor} {99 has} {826 gvwr} {221 of} {421 at least} {-21 70000 pounds} {10 then} {328 tractor} {712 stop} {90 in} {438 at most} {-21 310 feet} {66.} |
| 5 | Semantic Frames | (if, tractor has speed of 60 mph) (and, tractor is load-to-gvwr) (and, tractor has 4 axles) (and, tractor has gvwr of at least 70000 pounds) (then) (tractor, stop, in at most 310 feet) |
| 6 | Semantic Expressions | Antecedent: (if, tractor has speed of 60 mph) (and, tractor is load-to-gvwr) (and, tractor has 4 axles) (and, tractor has gvwr of at least 70000 pounds)<br>Consequent: (tractor, stop, in at most 310 feet) |
| 7 | Intermediate Representation | (COMPOUND and<br>  (PROPERTY tractor (CONSTRAINT == speed (UNIT mph 60)))<br>    (STATE tractor load-to-gvwr)<br>    (PROPERTY tractor (CONSTRAINT == axel (UNIT none 4)))<br>    (PROPERTY tractor<br>      (CONSTRAINT >= gvwr (UNIT pounds 70000))<br>    )<br>) -><br>(ACTION tractor<br>  (CONSTRAINED-ACTION<br>    (ACTION stop) (CONSTRAINT <= (UNIT feet 310))<br>  )<br>) |
| 8 | Verification Statement | ((tractor.speed=60)&(tractor.is-loaded-to-GVWR)&(tractor.axels=4)&(tractor.GVWR>=70000)) -> stops(feet<=310) |

Figure 3:
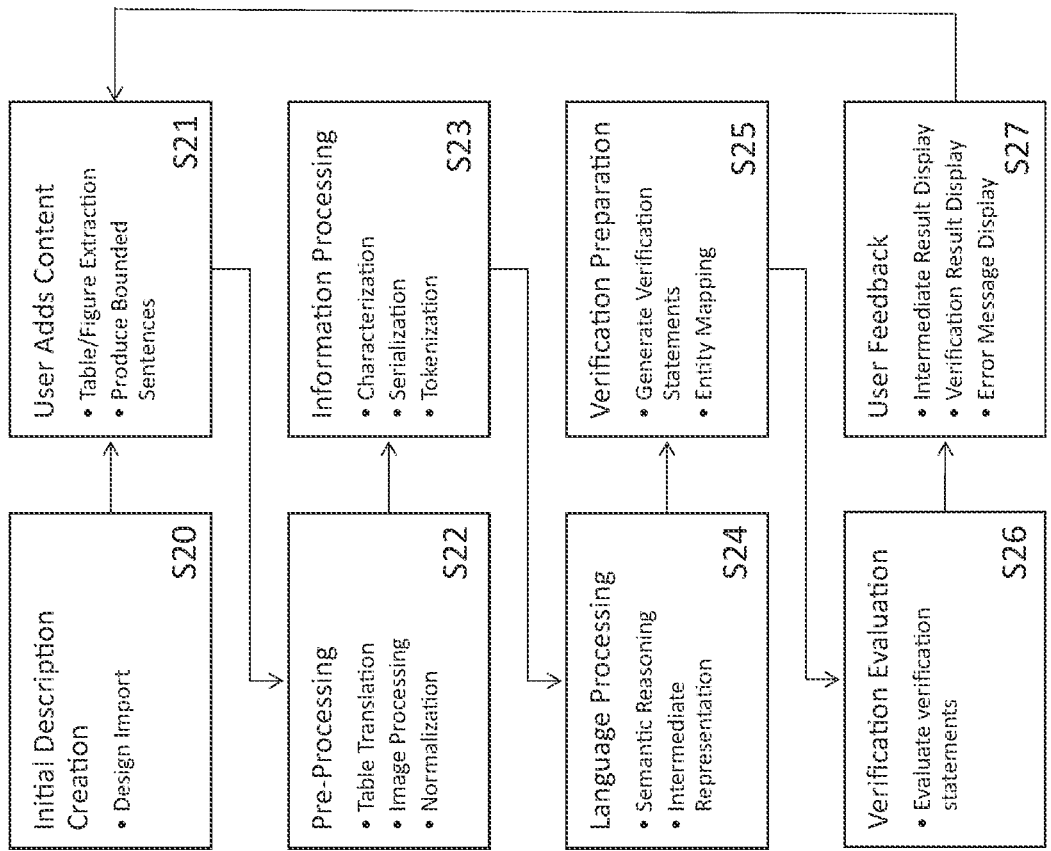
FIG. 3 is a flowchart showing computer-implemented steps for performing an NLLV natural language description creation process in accordance with example embodiments.

FIG. 3 is a flowchart showing computer-implemented steps for an NLLV natural language description creation process in accordance with example embodiments. This process is similar to that shown in FIG. 2; however, the process shown in FIG. 3 is performed during the creation of a new natural language description file instead of using an based on the feedback or continue to add new content to the description file. Any revised or new content is re-processed by returning control to step S21 to repeat steps S21-S27 after the modifications are performed.

Figure 4:
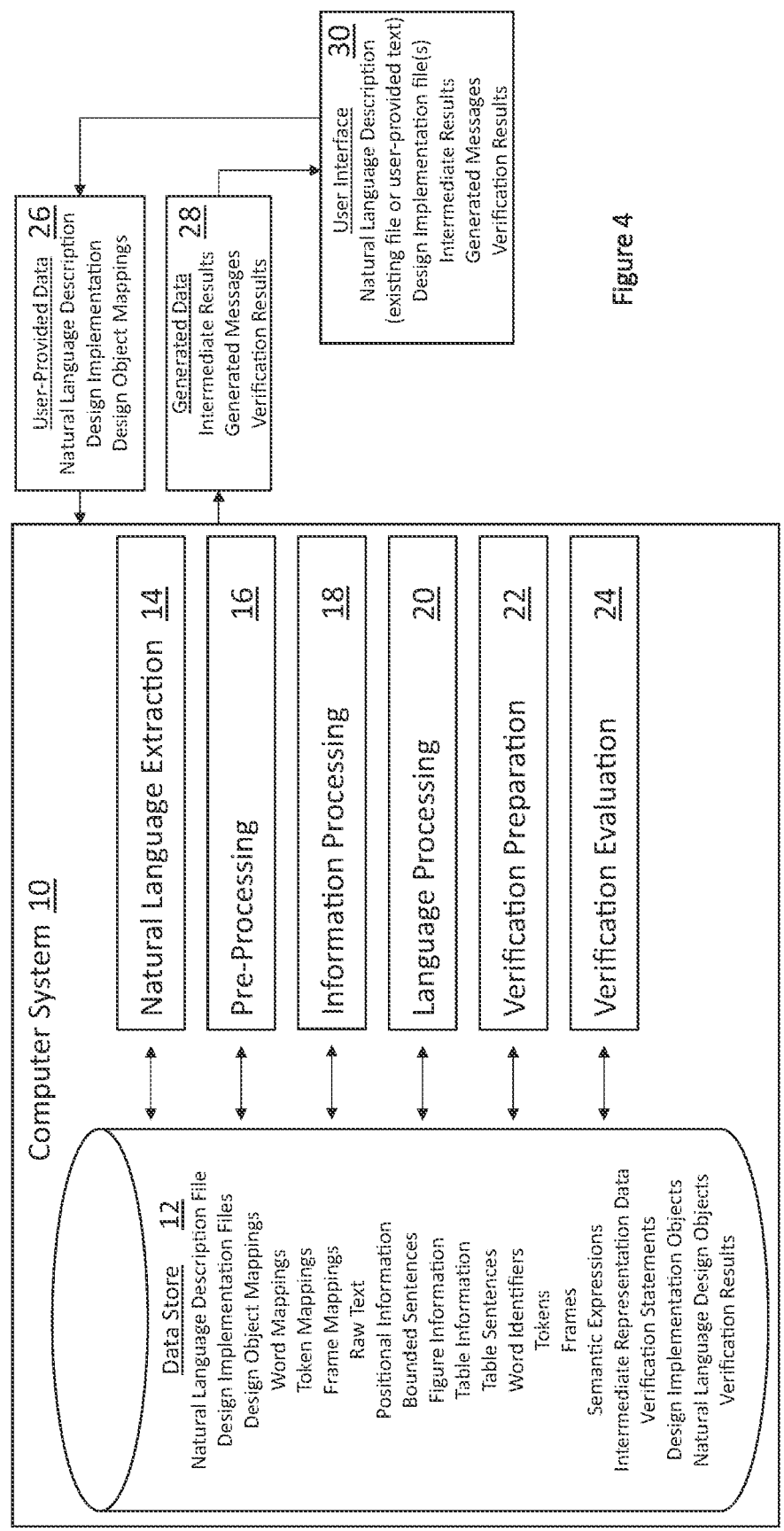
FIG. 4 is an example computer system for implementing the NLLV process in FIG. 2 in accordance with example embodiments.

FIG. 4 is an example computer system 10 for implementing the NLLV process in FIG. 2 and FIG. 3 in accordance with example embodiments. The computer system 10 includes a data store 12 and six processing modules 14-24. The data store 12 may be one or more memories or use cloud-based storage. The data store 12 stores computer program code, e.g., for the processing modules 14-24, and data for each electronic document file for a design, such as: a natural language description, raw text, positional information, bounded sentences, figure information, table information, table sentences, mappings, word identifiers, tokens, frames, semantic expressions, intermediate representation data, verification statements, design implementation, design objects, and verification results. Some document files may not include some of these data categories such as figure information, and some document files may include data categories not included in the above example list.

The data store 12 contains many types of information that can either be provided by the user, included as a part of the software in the computer system used to implement the NLLV, or generated by the processing modules 14-24. Some of the data in the data store 12 is user-provided data 26 input via a user interface 30 to the computer system 10 and includes, for example, a design document natural language description file, one or more design implementation files, and design object mappings. Design object mappings map design objects (e.g., names described in the natural language description file like the name "clock") to corresponding design implementation objects (e.g., names used in the design implementation file like "clk"). The other mappings in the data store 12 are included in the computer system for use by the Information Processing 18 and Language Processing 20 modules. The word mappings in the data store 12 include information necessary to translate words into a corresponding word identifier, where a word identifier is a numeric value that identifies a word and includes metadata such as part of speech or conjugation. The token mappings in the data store 12 include information necessary to group word identifiers into corresponding tokens, where a token is a group of words that convey a single thought. The frame mappings in the data store 12 include the information necessary to group tokens into corresponding frames.

The remaining information shown in the data store 12 in FIG. 4 is generated by the processing modules 14-24. Positional information includes the location of each raw text character in the rendered natural language document. Bounded sentences are sentences identified in the raw text that include a starting character (typically a capital letter) and an ending character (typically a period). Figure information includes the enumerated figures in the natural language document along with their positional information and/or resource names. The figure information allows figures to be identified and easily extracted from the natural language document. Table information includes the positional information for each table, table row, table column, and table cell found in the natural language document along with the text contained within each table cell. Table sentences are proper sentences generated by the pre-processing module 16 that contain the information presented in tables (which is not typically embodied in proper sentences). Semantic expressions store the frames of a sentence in groups of antecedents, consequents, and modifiers. The data store 12 includes an intermediate representation data structure for each bounded sentence, which includes design objects, design object properties, and the relationships between them. Verification statements are generated from intermediate representation data structures and can be evaluated by a design implementation verification process. Design implementation objects are entities that exist in a design implementation, including, for example, modules, ports, signals, and registers. Natural language design objects are featured in Natural Language Description documents and reference corresponding design implementation objects, although their names may differ from the design implementation. Verification results are produced by a design implementation verification process and indicate whether each verification statement passes or fails evaluation.

In example embodiments, the natural language extraction processing module 14 performs the operations described for step S10; the pre-processing module 16 performs the operations described for step S11; the information processing module 18 performs the operations described for step S12; the language processing module 20 performs the operations described for step S13; the verification preparation module 22 performs the operations described for step S14; the user interface 30 performs the operations described for step S15; and the verification evaluation module 24 performs the operations described for step S16. All of the modules 14-24 generate intermediate results and generated messages as part of generated data 28, and the verification preparation and evaluation modules 22 and 24 also provide generated data 28 that includes verification results to the user interface 30 where the user can view the generated data 28.

Figure 5:
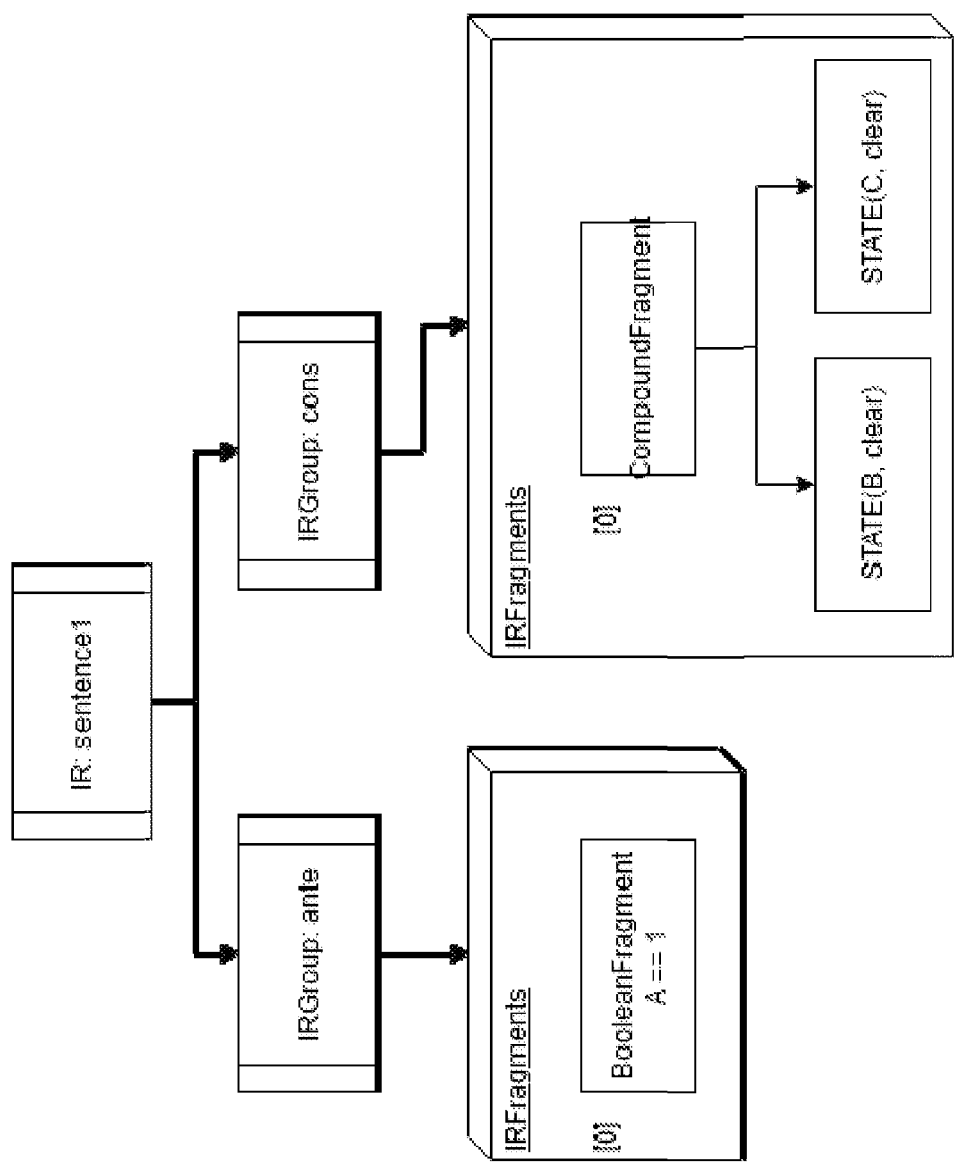
FIG. 5 shows an example intermediate representation data structure in accordance with example embodiments.

FIG. 5 shows an example intermediate representation (IR) data structure for verifiable statements in accordance with example embodiments. Rather than restricting the NLLV technology to a single formal language such as SystemVerilog Assertions (SVA) or linear temporal logic (LTL), an intermediate representation allows for the end user to choose which proving system is used depending on the user needs. To facilitate verification statement generation, the intermediate representation is stored in a structure resembling a parse tree with antecedent and consequent fragments grouped together in separate branches. Each leaf in the tree is an IRFragments object corresponding to a fragment of the original sentence's semantic expression. Each fragment contains the relevant contextual information for objects it applies to, values/properties that are being applied, compound operators and relationships between fragments, and Boolean operators. Interpretation of the intermediate representation simply requires examining the data structure properties and fields. FIG. 5 provides an example of the intermediate representation data structure for the sentence "When A is asserted, then B and C are cleared." The data structure includes two IRGroup objects—antecedent (ante) and consequent (cons). Each group has a single IRFragments object; however, the consequent group uses a compound fragment to represent the transformation of "B and C are cleared" to "B is cleared, and C is cleared."

Figure 6:
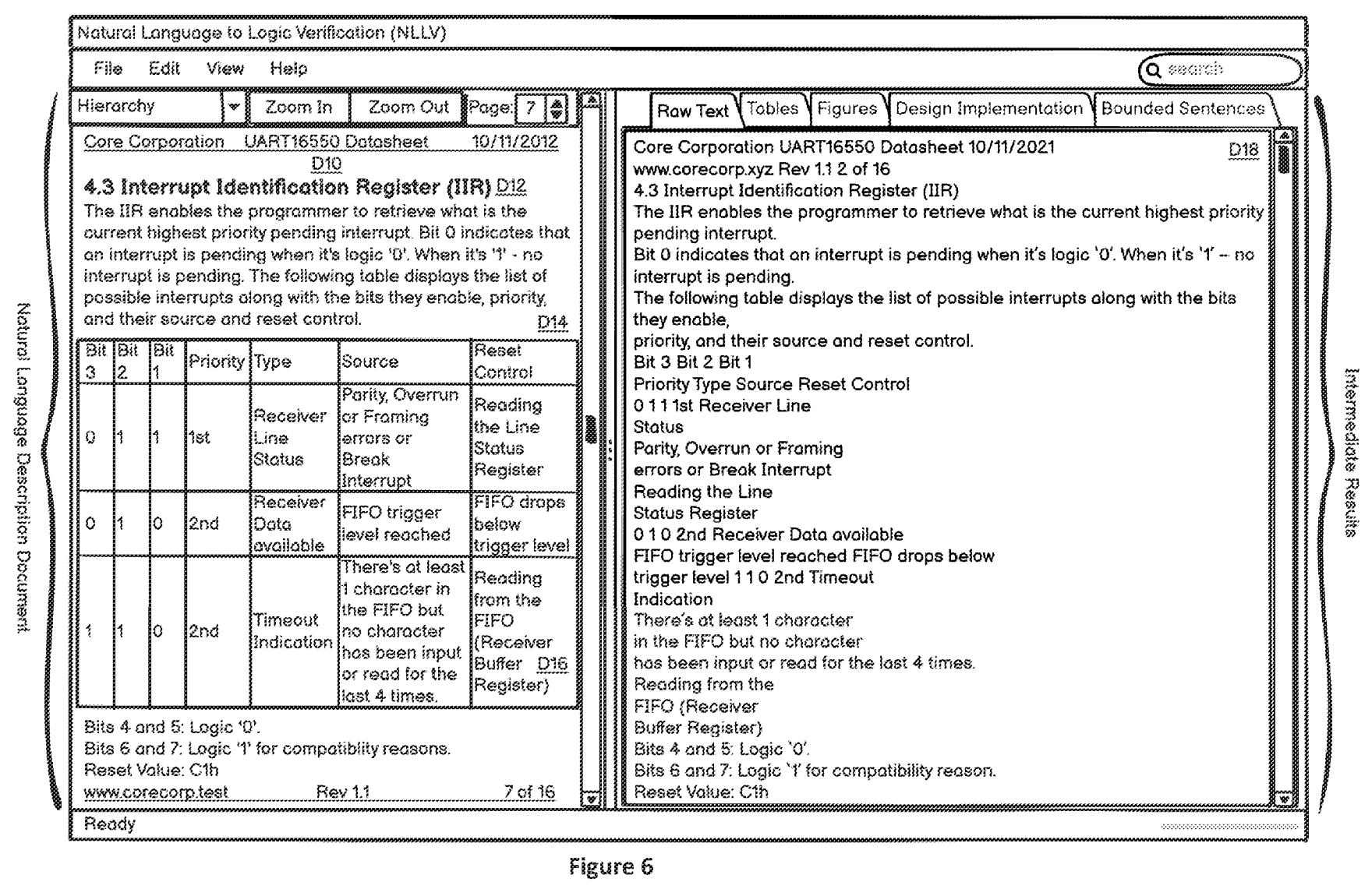

FIG. 6 shows an example graphical user interface (GUI) with extracted text and a reconstructed hierarchy in accordance with example embodiments. The left side of the interface shows an example "Natural Language Description Document" indicated with a brace. The labeled portions of the document illustrate the recognized components of the document hierarchy which includes page header (labeled as D10), section header (labeled as D12), paragraphs (labeled as D14), and a table (labeled as D16). The right side of the interface shows the raw text (labeled as D18) naively extracted from the document and illustrates the need to reconstruct the hierarchy and pre-process the table contents. Without reconstruction or pre-processing, the raw text as shown in the figure cannot be directly used or at least is difficult to use directly.

Figure 7:
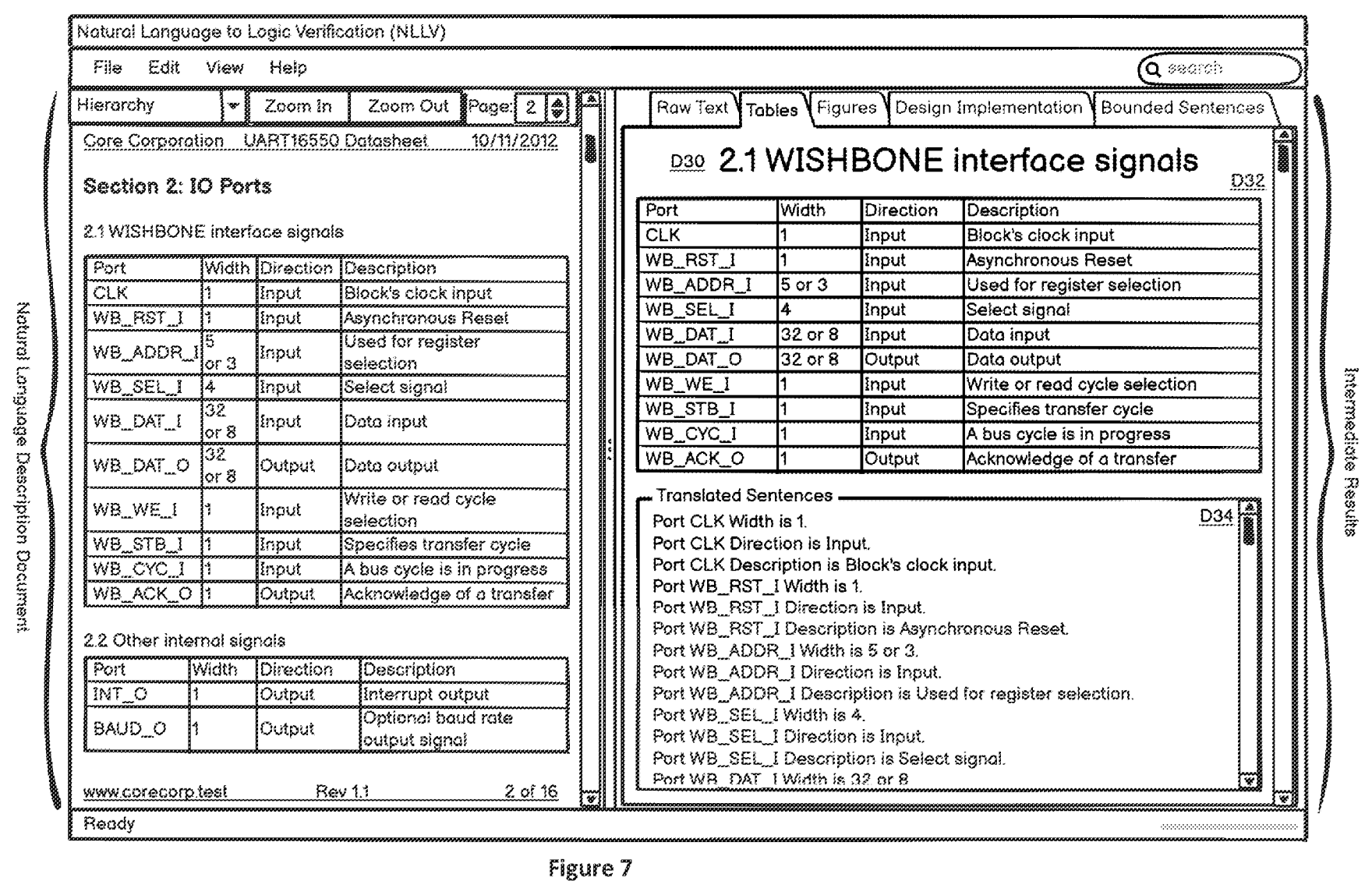

FIG. 7 shows an example GUI with table detection and translation in accordance with example embodiments. The left side of the interface shows an example natural language document, labeled as "Natural Language Description Document" and indicated with a brace, similar to FIG. 6. The upper right side of FIG. 7 shows the extracted table information, including a caption (labeled as D30) and table contents organized into rows and columns (labeled as D32). The lower right side of FIG. 7 shows the sentences translated (labeled as D34) from the table shown in the upper right. In this simple example, the sentences follow the pattern of "<first column header> <row header> <column header> is <cell content>." Together, the upper and lower right side of FIG. 7 are labeled "Intermediate Results" with a brace.

Figure 8:
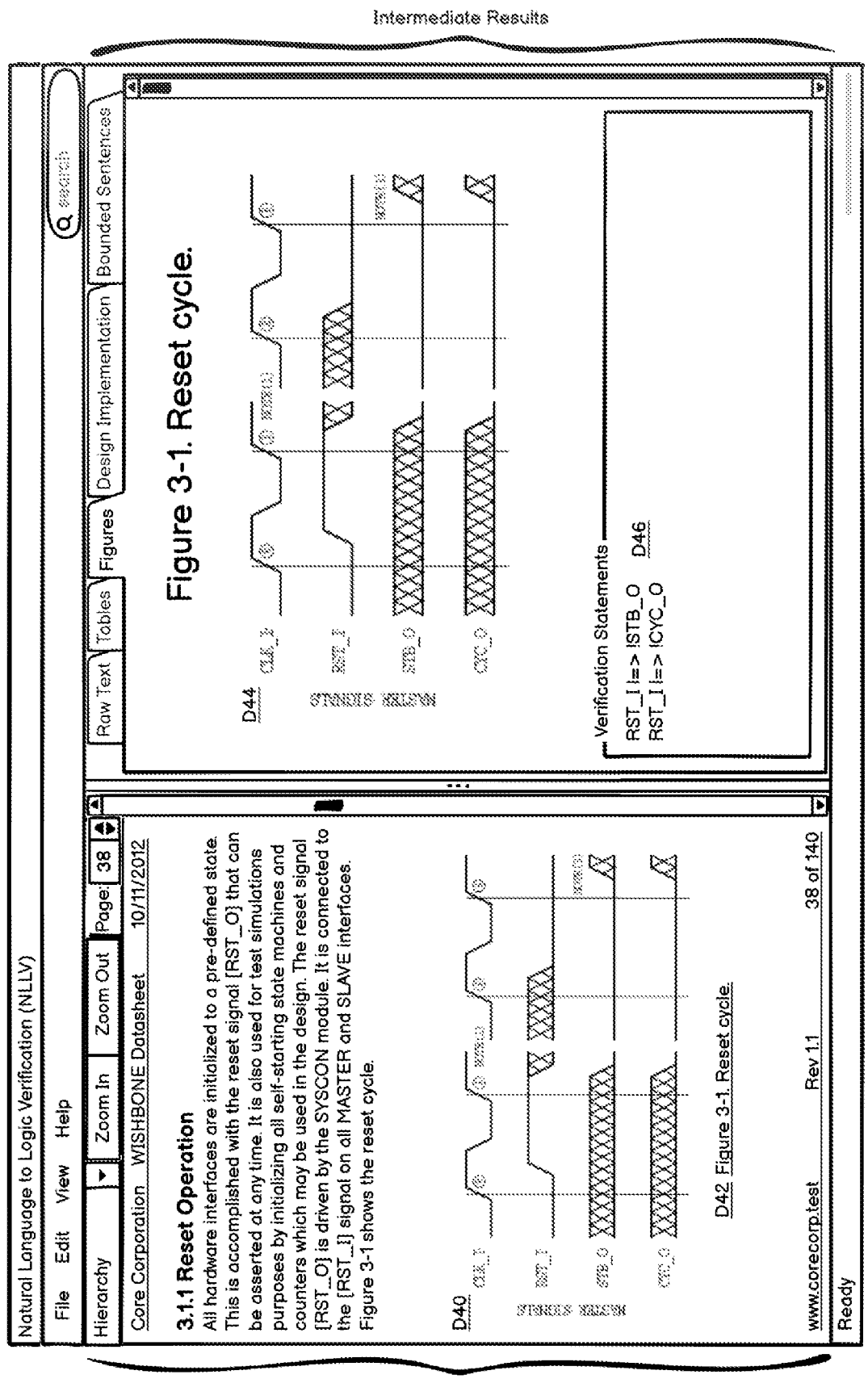
FIG. 8 shows an example GUI with image processing in accordance with example embodiments.

FIG. 8 shows an example GUI with figure detection of a timing diagram in accordance with example embodiments. The left side of the interface shows an example "Natural Language Description Document" indicated with a brace, similar to FIG. 6 and FIG. 7. The timing diagram (labeled as D40) indicates the detection of a figure, while the caption (labeled as D42) indicates that the caption was also detected. The upper right side of FIG. 8 shows that the timing diagram as extracted (labeled as D44) from the natural language document. The lower right side of FIG. 8 shows example verification statements (labeled as D46) produced after applying image processing techniques to extract the timing information depicted in the figure extracted from the natural language document.

FIG. 9 shows an example GUI with entities parsed from a design implementation and mapped to the entities found in the example natural language description in accordance with example embodiments. The right side of the figure shows the design hierarchy parsed from the implementation, including modules (labeled as D50), ports (labeled as D52), and signals (labeled as D54). The left side of the figure shows a corresponding natural language description document, indicated with a brace, including the names of design objects (labeled as D56) recognized in the implementation.

Figure 10:
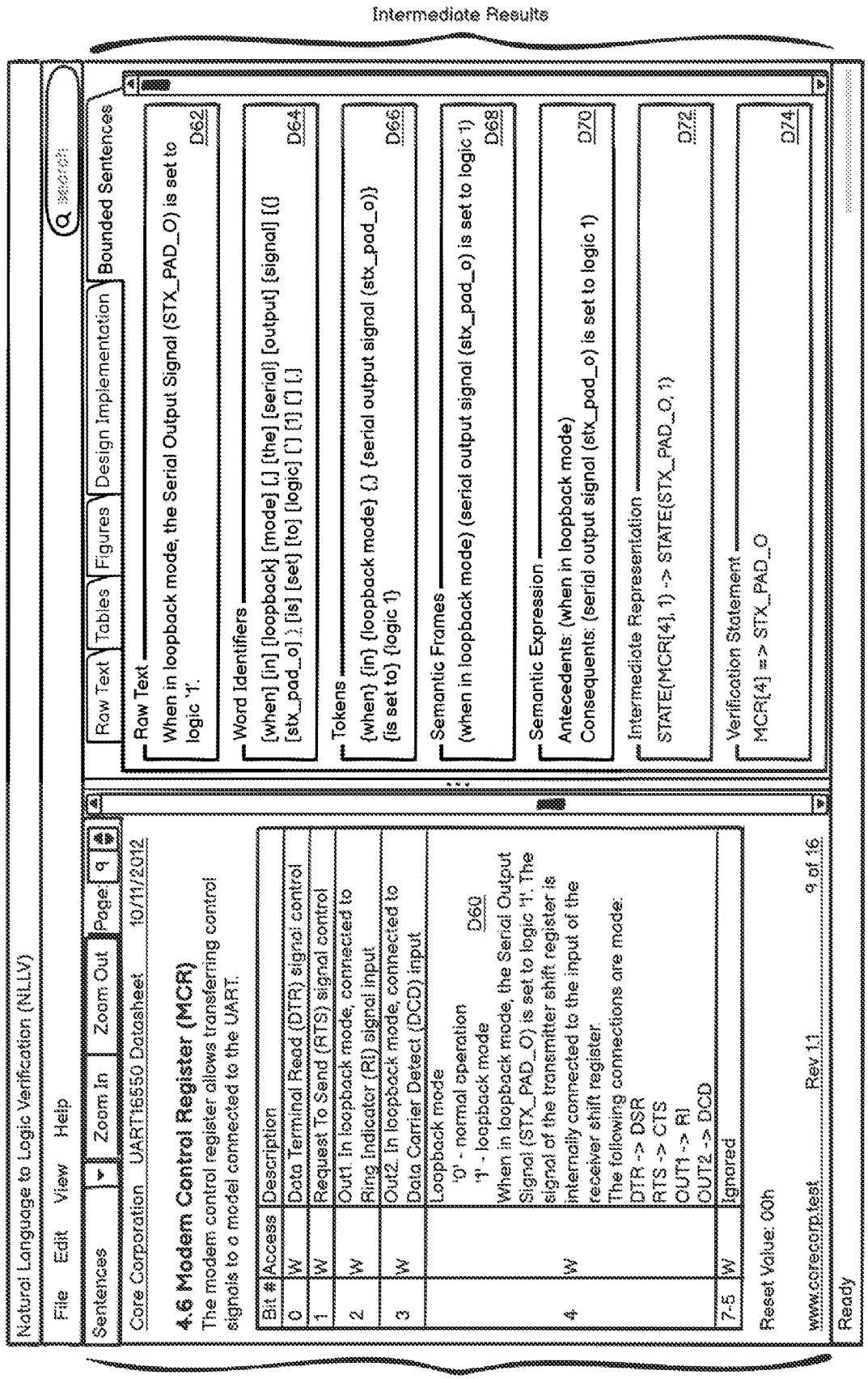
FIG. 10 shows an example GUI with language engine results and feedback in accordance with example embodiments.

FIG. 10 shows an example GUI with language engine results in accordance with example embodiments. The left side of the figure shows the natural language description document, indicated with a brace, with processed sentences and table cells (labeled as D60) that were translated into sentences. The right side of the figure shows the intermediate results for one bounded sentence, including the raw text (labeled as D62) extracted from the document, the word identifiers (labeled as D64) for the sentence, the tokens (labeled as D66) assembled from the word identifiers, the semantic frames (labeled as D68) assembled from the tokens, the semantic expression (labeled as D70) assembled from the frames, the intermediate representation (labeled as D72) generated from the semantic expression, and finally the verification statement (labeled as D74) generated from the intermediate representation.

Figure 11:
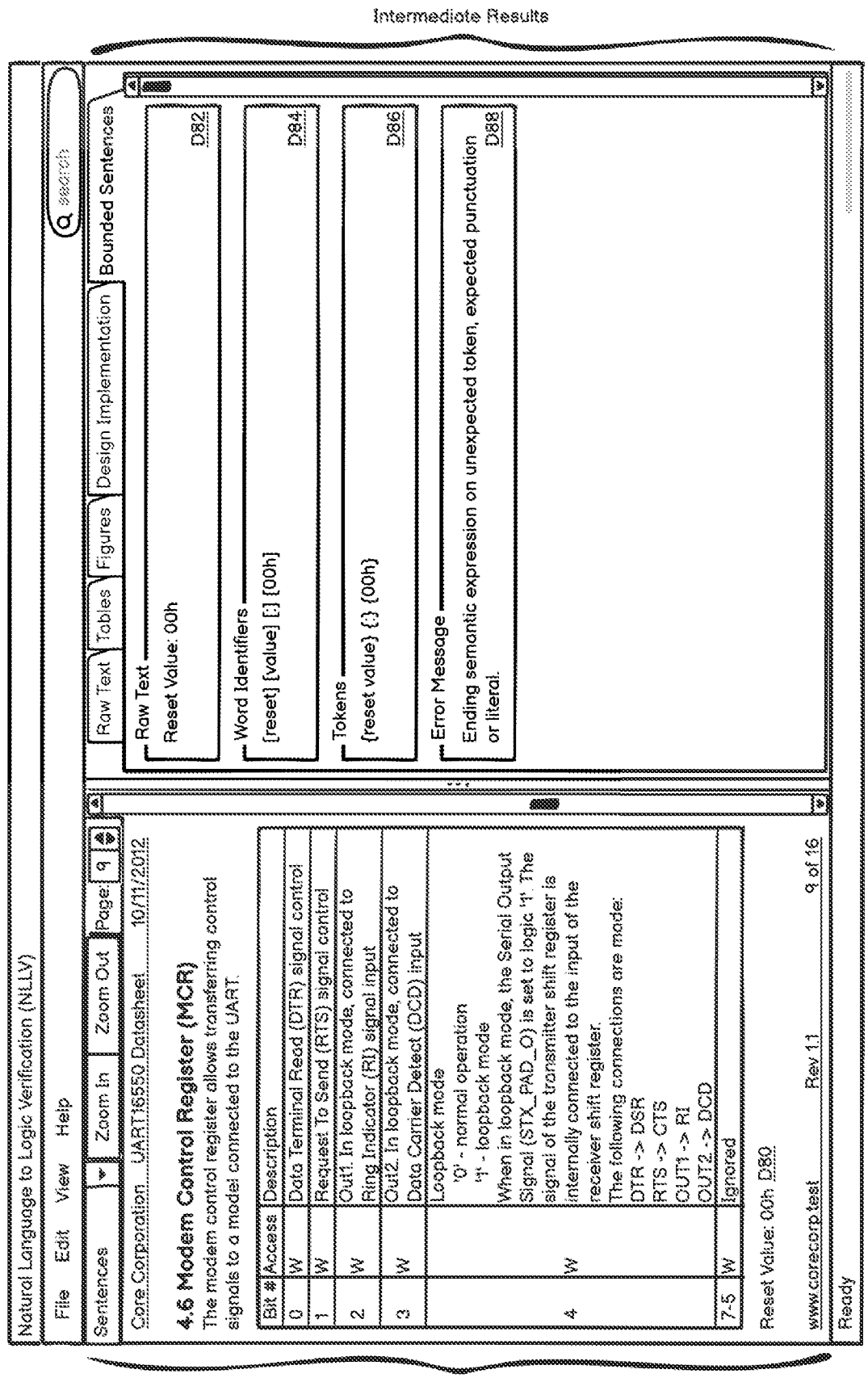
FIG. 11 shows an example GUI with language engine results and a generated error message in accordance with example embodiments.

FIG. 11 shows an example GUI with language engine results that include an error message generated when processing a malformed sentence in accordance with example embodiments. The left side of the figure shows the natural language description document, indicated with a brace, showing the text (labeled as D80) that caused an error to be generated. The right side of the figure shows the intermediate results for each processing stage up until the error was encountered, including the raw text (labeled as D82) extracted from the document, the word identifiers (labeled as D84), the tokens (labeled as D86), and finally an error message (labeled as D88) that informs the user of the cause of the error when attempting to produce a semantic expression.

Figure 12:
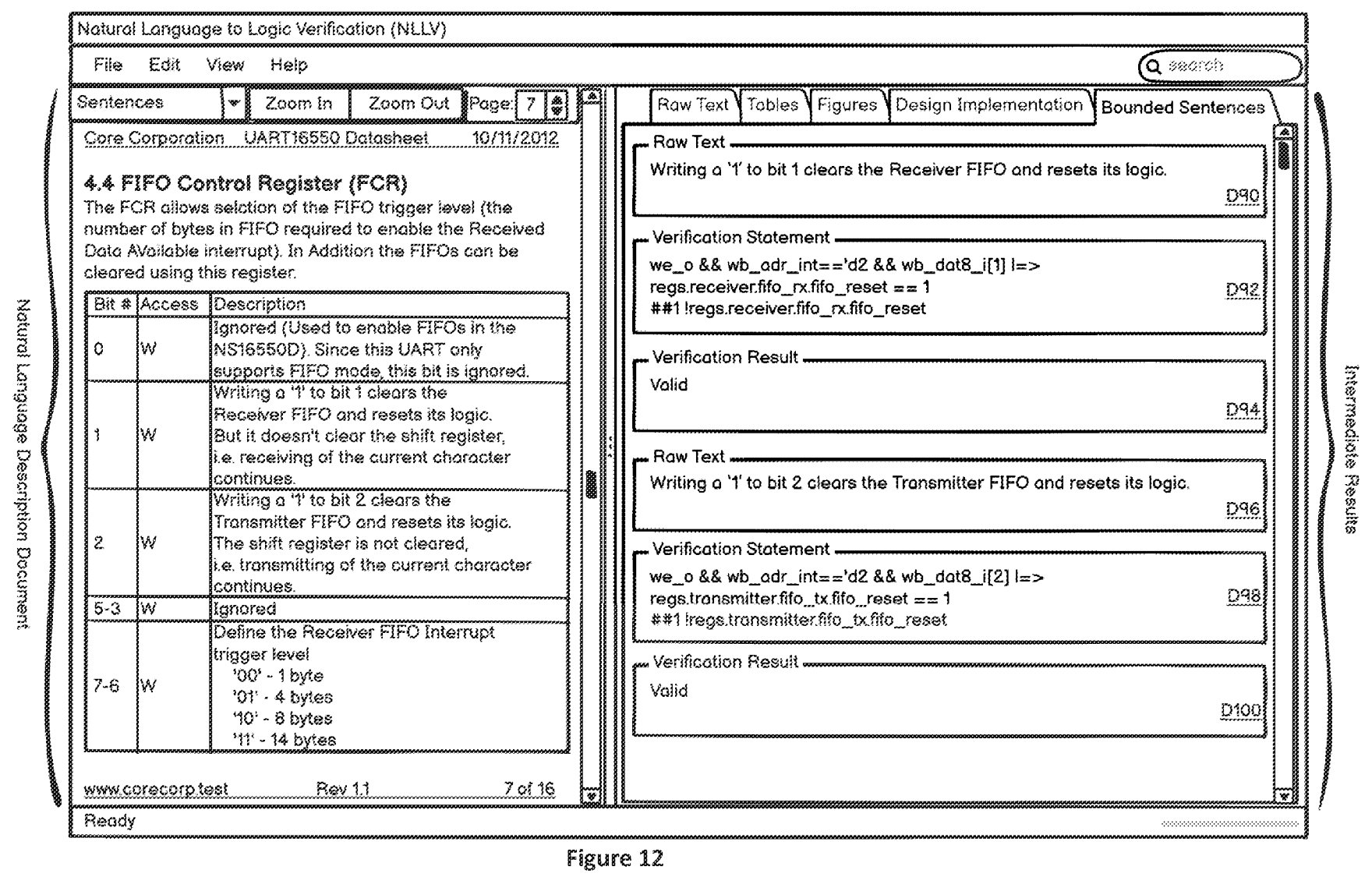

FIG. 12 shows an example GUI with language engine results that include generated verification statements and verification results. The left side of the figure shows the natural language description document, labeled with a brace, with sentences that were translated to verification statements by the language engine. The right side of the figure shows the raw text extracted from the document for two sentences (D90 and D96), the verification statements generated for the two sentences (D92 and D98), and the verification results of the statements (D94 and D100).

The results may look somewhat different for a natural language description document that corresponds to a software design rather than a hardware design. For example, an API (application programming interface) specification document would describe the software functions defined in a third party software library that can be invoked by a software application. The API defines the input and output parameters as well as the behavior of each software function. The results of the NLLV process can be the same up to and including the intermediate representation (including raw text extracted, word identifiers, tokens, and semantic expressions). A difference is the verification statements generated from the intermediate representation. The verification statements must use a format that can be verified using a design implementation verification process suitable for software designs. One example of such format is the ANSI/ISO C Specification Language (ACSL), which includes the notion of a function contract that expresses the types of properties defined in an API specification document. The NLLV process therefore uses the properties defined in the API specification and captured in the intermediate representation to generate verification statements in the form of ACSL function contracts.

FIG. 13 illustrates an example computer system 500 that may be used according to some embodiments to implement the processing modules 14-24 and the operations of the computer system 10. In some embodiments, the computing device 500 includes one or more of the following: one or more processors 502; one or more memory devices 504; one or more network interface devices 506; one or more display interfaces 508; and one or more user input adapters 510. Additionally, in some embodiments, the computing device 500 is connected to or includes a display device 512. As will be explained below, these elements (e.g., the processors 502, memory devices 504, network interface devices 506, display interfaces 508, user input adapters 510, display device 512) are hardware devices (for example, electronic circuits or combinations of circuits) that are configured to perform various different functions for the computing device 500.

In some embodiments, each or any of the processors 502 is or includes, for example, a single-core or multi-core processor, a microprocessor (e.g., which may be referred to as a central processing unit or CPU), a digital signal processor (DSP), a microprocessor in association with a DSP core, an Application Specific Integrated Circuit (ASIC), a Field Programmable Gate Array (FPGA) circuit, or a system-on-a-chip (SOC) (e.g., an integrated circuit that includes a CPU and other hardware components such as memory, networking interfaces, and the like). And/or, in some embodiments, each or any of the processors 502 uses an instruction set architecture such as x86 or Advanced RISC Machine (ARM).

In some embodiments, each or any of the memory devices 504 is or includes a random access memory (RAM) (such as a Dynamic RAM (DRAM) or Static RAM (SRAM)), a flash memory (based on, e.g., NAND or NOR technology), a hard disk, a magneto-optical medium, an optical medium, cache memory, a register (e.g., that holds instructions), or other type of device that performs the volatile or non-volatile storage of data and/or instructions (e.g., software that is executed on or by processors 502). Memory devices 504 are examples of non-volatile computer-readable storage media.

In some embodiments, each or any of the network interface devices 506 includes one or more circuits (such as a baseband processor and/or a wired or wireless transceiver), and implements layer one, layer two, and/or higher layers for one or more wired communications technologies (such as Ethernet (IEEE 802.3)) and/or wireless communications technologies (such as Bluetooth, WiFi (IEEE 802.11), GSM, CDMA2000, UMTS, LTE, LTE-Advanced (LTE-A), and/or other short-range, mid-range, and/or long-range wireless communications technologies). Transceivers may comprise circuitry for a transmitter and a receiver. The transmitter and receiver may share a common housing and may share some or all of the circuitry in the housing to perform transmission and reception. In some embodiments, the transmitter and receiver of a transceiver may not share any common circuitry and/or may be in the same or separate housings.

In some embodiments, each or any of the display interfaces 508 is or includes one or more circuits that receive data from the processors 502, generate (e.g., via a discrete GPU, an integrated GPU, a CPU executing graphical processing, or the like) corresponding image data based on the received data, and/or output (e.g., a High-Definition Multimedia Interface (HDMI), a DisplayPort Interface, a Video Graphics Array (VGA) interface, a Digital Video Interface (DVI), or the like), the generated image data to the display device 512, which displays the image data. Alternatively or additionally, in some embodiments, each or any of the display interfaces 508 is or includes, for example, a video card, video adapter, or graphics processing unit (GPU).

In some embodiments, each or any of the user input adapters 510 is or includes one or more circuits that receive and process user input data from one or more user input devices (not shown) that are included in, attached to, or otherwise in communication with the computing device 500, and that output data based on the received input data to the processors 502. Alternatively or additionally, in some embodiments each or any of the user input adapters 510 is or includes, for example, a PS/2 interface, a USB interface, a touchscreen controller, or the like; and/or the user input adapters 510 facilitates input from user input devices (not shown) such as, for example, a keyboard, mouse, trackpad, touchscreen, etc.

In some embodiments, the display device 512 may be a Liquid Crystal Display (LCD) display, Light Emitting Diode (LED) display, or other type of display device. In embodiments where the display device 512 is a component of the computing device 500 (e.g., the computing device and the display device are included in a unified housing), the display device 512 may be a touchscreen display or non-touchscreen display. In embodiments where the display device 512 is connected to the computing device 500 (e.g., is external to the computing device 500 and communicates with the computing device 500 via a wire and/or via wireless communication technology), the display device 512 is, for example, an external monitor, projector, television, display screen, etc.

In various embodiments, the computing device 500 includes one, or two, or three, four, or more of each or any of the above-mentioned elements (e.g., the processors 502, memory devices 504, network interface devices 506, display interfaces 508, and user input adapters 510). Alternatively or additionally, in some embodiments, the computing device 500 includes one or more of: a processing system that includes the processors 502; a memory or storage system that includes the memory devices 504; and a network interface system that includes the network interface devices 506.

The computing device 500 may be arranged, in various embodiments, in many different ways. In various embodiments, the computing device 500 includes one, or two, or three, four, or more of each or any of the above-mentioned elements (e.g., the processors 502, memory devices 504, network interface devices 506, display interfaces 508, and user input adapters 510). Alternatively, or additionally, in some embodiments, the computing device 500 includes one or more of: a processing system that includes the processors 502; a memory or storage system that includes the memory devices 504; and a network interface system that includes the network interface devices 506. Alternatively, or additionally, in some embodiments, the computing device 500 includes a system-on-a-chip (SoC) or multiple SoCs, and each or any of the above-mentioned elements (or various combinations or subsets thereof) is included in the single SoC or distributed across the multiple SoCs in various combinations. For example, the single SoC (or the multiple SoCs) may include the processors 502 and the network interface devices 506; or the single SoC (or the multiple SoCs) may include the processors 502, the network interface devices 506, and the memory devices 504; and so on. Further, the computing device 500 may be arranged in some embodiments such that: the processors 502 include a multi- (or single)-core processor; the network interface devices 506 include a first short-range network interface device (which implements, for example, WiFi, Bluetooth, NFC, etc.) and a second long-range network interface device that implements one or more cellular communication technologies (e.g., 3G, 4G LTE, CDMA, etc.); and the memory devices 504 include a RAM and a flash memory. As another example, the computing device 500 may be arranged in some embodiments such that: the processors 502 include two, three, four, five, or more multi-core processors; the network interface devices 506 include a first network interface device that implements Ethernet and a second network interface device that implements WiFi and/or Bluetooth; and the memory devices 504 include a RAM and a flash memory or hard disk.

As previously noted, whenever it is described in this document that a software module or software process performs any action, the action is in actuality performed by underlying hardware elements according to the instructions that comprise the software module. As stated above, the computer system 10, including the data store 12 and the processing modules 14-24, and the user interface 30, each of which will be referred to individually for clarity as a "component" for the remainder of this paragraph, are implemented using an example of the computing device 500 of FIG. 13. In such embodiments, the following applies for each component: (a) the elements of the computing device 500 shown in FIG. 13 (i.e., the one or more processors 502, one or more memory devices 504, one or more network interface devices 506, one or more display interfaces 508, and one or more user input adapters 510), or appropriate combinations or subsets of the foregoing) are configured to, adapted to, and/or programmed to implement each or any combination of the actions, activities, or features described herein as performed by the component and/or by any software modules described herein as included within the component; (b) alternatively or additionally, to the extent it is described herein that one or more software modules exist within the component, in some embodiments, such software modules (as well as any data described herein as handled and/or used by the software modules) are stored in the memory devices 504 (e.g., in various embodiments, in a volatile memory device such as a RAM or an instruction register and/or in a non-volatile memory device such as a flash memory or hard disk) and all actions described herein as performed by the software modules are performed by the processors 502 in conjunction with, as appropriate, the other elements in and/or connected to the computing device 500 (i.e., the network interface devices 506, display interfaces 508, user input adapters 510, and/or display device 512); (c) alternatively or additionally, to the extent it is described herein that the component processes and/or otherwise handles data, in some embodiments, such data is stored in the memory devices 504 (e.g., in some embodiments, in a volatile memory device such as a RAM and/or in a non-volatile memory device such as a flash memory or hard disk) and/or is processed/handled by the processors 502 in conjunction with, as appropriate, the other elements in and/or connected to the computing device 500 (i.e., the network interface devices 506, display interfaces 508, user input adapters 510, and/or display device 512); (d) alternatively or additionally, in some embodiments, the memory devices 502 store instructions that, when executed by the processors 502, cause the processors 502 to perform, in conjunction with, as appropriate, the other elements in and/or connected to the computing device 500 (i.e., the memory devices 504, network interface devices 506, display interfaces 508, user input adapters 510, and/or display device 512), each or any combination of actions described herein as performed by the component and/or by any software modules described herein as included within the component.

The hardware configurations shown in FIG. 13 and described above are provided as examples, and the subject matter described herein may be utilized in conjunction with a variety of different hardware architectures and elements. For example: in many of the Figures in this document, individual functional/action blocks are shown; in various embodiments, the functions of those blocks may be implemented using (a) individual hardware circuits, (b) using an application specific integrated circuit (ASIC) specifically configured to perform the described functions/actions, (c) using one or more digital signal processors (DSPs) specifically configured to perform the described functions/actions, (d) using the hardware configuration described above with reference to FIG. 13, (e) via other hardware arrangements, architectures, and configurations, and/or via combinations of the technology described in (a) through (e).

There are many technical advantages of the subject matter described above, some examples of which are now described. The technological improvements offered by the technology described in this application can be applied for example to verify a hardware design implementation and/or a software design implementation to ensure that it accurately and fully implements the design as described in one or more natural language documents as explained in detail above. The computer-implemented verification is much faster and less expensive than if the verification were performed for example by an engineer, and no skilled personnel are required to perform the verification. The computer-implemented verification also removes the chance for errors introduced by humans that produce verification statements in a traditional verification workflow.

In known formal verification workflows for hardware design implementations, an engineer skilled in the art of verification must develop a set of verification statements that fully describes the correct operation of the design implementation. These verification statements are then verified by an Electronic Design Automation (EDA) tool that evaluates the verification statements against the corresponding design implementation. Known formal verification tools are not able to identify the features of a design that should be verified, nor can they automatically generate the verification statements from a design specification or other natural language description.

Other known formal verification tools perform verification by comparing the equivalency of two hardware design implementations. These equivalency checking tools may be used to compare design representations between the various stages of design implementation (e.g., synthesis, optimization, etc.) to ensure a design's functionality has not been altered throughout these stages. However, comparing hardware design implementations does not guarantee any properties of the design implementation.

Simulations can also be performed to verify the functionality of hardware design implementations and/or software design implementations. Similar to formal verification workflows, simulation verification workflows require verification statements that are used to verify design properties and features. However, simulations also require input stimulus to be defined to ensure the functionality covered by verification statements will be triggered by the simulation. Known simulation verification tools are not able to identify the features of a design that should be verified. Nor can they automatically generate the verification statements or input stimulus from a design specification or other natural language description.

In contrast to these various approaches for verification, the NLLV technology described above accurately and reliably: (i) identifies the functionality that should be verified and (ii) generates verification statements by processing a natural language description file corresponding to the design implementation.

As explained in the example embodiments described above, the technology may be applied in one or more domains to quantify the verification coverage provided by a natural language description document over a corresponding design implementation, e.g., as a coverage metric. The technology can also allow users to view verification results in the context of the natural language description as opposed to the verification statements themselves. This aspect of the technology allows users who are not experts in verification and may not be familiar with the syntax of verification statements to understand the properties that were violated or otherwise not properly satisfied in the design implementation via their natural language description.

As described above in the example embodiments associated with FIG. 3, the technology can be applied during the creation of natural language description documents to assist writers by avoiding ambiguous statements and ensure that the corresponding design implementation is fully covered by the natural language description document. See the notation of user-provided text entered by a user in the user interface 30 shown in FIG. 4 for creating a natural language description file. For example, the technology can be integrated in a word processing software application that, when executed on a computer, allows writers to create natural language description documents and augment existing spelling and grammar checking capabilities with feedback provided by the language engine.

Whenever it is described in this document that a given item is present in "some embodiments," "various embodiments," "certain embodiments," "certain example embodiments, "some example embodiments," "an exemplary embodiment," or whenever any other similar language is used, it should be understood that the given item is present in at least one embodiment, though is not necessarily present in all embodiments. Consistent with the foregoing, whenever it is described in this document that an action "may," "can," or "could" be performed, that a feature, element, or component "may," "can," or "could" be included in or is applicable to a given context, that a given item "may," "can," or "could" possess a given attribute, or whenever any similar phrase involving the term "may," "can," or "could" is used, it should be understood that the given action, feature, element, component, attribute, etc. is present in at least one embodiment, though is not necessarily present in all embodiments. Terms and phrases used in this document, and variations thereof, unless otherwise expressly stated, should be construed as open-ended rather than limiting. As examples of the foregoing: "and/or" includes any and all combinations of one or more of the associated listed items (e.g., a and/or b means a, b, or a and b); the singular forms "a", "an" and "the" should be read as meaning "at least one," "one or more," or the like; the term "example" is used provide examples of the subject under discussion, not an exhaustive or limiting list thereof; the terms "comprise" and "include" (and other conjugations and other variations thereof) specify the presence of the associated listed items but do not preclude the presence or addition of one or more other items; and if an item is described as "optional," such description should not be understood to indicate that other items are also not optional.

As used herein, the term "non-transitory computer-readable storage medium" includes a register, a cache memory, a ROM, a semiconductor memory device (such as a D-RAM, S-RAM, or other RAM), a flash memory, a magnetic medium such as a hard disk, a magneto-optical medium, an optical medium such as a CD-ROM, a DVD, or Blu-Ray Disc, or other type of device for non-transitory electronic data storage. The term "non-transitory computer-readable storage medium" does not include a transitory, propagating electromagnetic signal.

Additional Applications of Described Subject Matter

Although process steps, algorithms or the like, including without limitation with reference to FIGS. 1-13, may be described or claimed in a particular sequential order, such processes may be configured to work in different orders. In other words, any sequence or order of steps that may be explicitly described or claimed in this document does not necessarily indicate a requirement that the steps be performed in that order; rather, the steps of processes described herein may be performed in any order possible. Further, some steps may be performed simultaneously (or in parallel) despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary, and does not imply that the illustrated process is preferred.

Although various embodiments have been shown and described in detail, the claims are not limited to any particular embodiment or example. None of the above description should be read as implying that any particular element, step, range, or function is essential. All structural and functional equivalents to the elements of the above-described embodiments that are known to those of ordinary skill in the art are expressly incorporated herein by reference and are intended to be encompassed. Moreover, it is not necessary for a device or method to address each and every problem sought to be solved by the present invention, for it to be encompassed by the invention. No embodiment, feature, element, component, or step in this document is intended to be dedicated to the public.

The invention claimed is:

1. A computer system for design verification, comprising:
at least one computer including at least one hardware processor; and
storage to store program instructions executable in the at least one computer that, when executed by the at least one hardware processor, cause the at least one computer to:
obtain a natural language description file corresponding to a design, where the design is a hardware design or a software design;
process the natural language description file to extract semantic expressions;
generate one or more intermediate representation data structures from selected ones of the semantic expressions, where each intermediate representation data structure includes natural language design objects, natural language design object properties, and relationships between natural language design objects and/or natural language design object properties; and
transform each intermediate representation data structure into one or more corresponding design verification statements derived from the natural language description file for subsequent evaluation against one or more design implementation files corresponding to the design.

2. The computer system in claim 1, wherein the program instructions, when executed, further cause the at least one computer to:
obtain and process the one or more design implementation files corresponding to the design to determine design implementation objects included in the one or more design implementation files;
create a mapping for each of the natural language design objects to a corresponding one of the design implementation objects;
based on the mappings, replace the natural language design objects in the design verification statements derived from the natural language description file with the corresponding design implementation objects to produced modified verification statements derived from the natural language description file,
wherein the subsequent evaluation includes evaluating the modified verification statements derived from the natural language description file against the one or more design implementation files.

3. The computer system in claim 2, wherein the program instructions, when executed, further cause the at least one computer to:
based on processing the natural language description file, display one or more mappings between natural language design objects and design implementation objects, and
allow a user to modify the one or more mappings between natural language design objects and design implementation objects.

4. The computer system in claim 1, wherein the natural language description file includes a hardware design description that includes one or more of the following: a datasheet, a specification document, a requirements document, and user provided text.

5. The computer system in claim 1, wherein the natural language description file includes a software design description that includes one or more of the following:
software documentation, a specification document, a requirements document, and user provided text.

6. The computer system in claim 1, wherein the program instructions, when executed, further cause the at least one computer to:
extract raw text and/or positional information from the natural language description file;
process extracted raw text and/or extracted positional information to reconstruct layout information pertaining to a hierarchical structure of the natural language description file;
process reconstructed layout information to generate one or more of the following: table information, figure information, header information, footer information, sentences, and paragraphs; and
translate the table information into sentences for processing to extract semantic expressions.

7. The computer system in claim 6, wherein the program instructions, when executed, further cause the at least one computer to image process the figure information to generate verification statements derived from the figure information.

8. The computer system in claim 1, wherein the program instructions, when executed, further cause the at least one computer to:
extract raw text from the natural language description file;
determine boundaries of sentences in the raw text to produce bounded sentences;
convert each of multiple words in each bounded sentence into a corresponding word identifier using a first mapping;
group a plurality of word identifiers into a corresponding token using a second mapping;
group a plurality of tokens into a corresponding frame by identifying predetermined frame patterns using a third mapping; and
form semantic expressions from sets of frames.

9. The computer system in claim 8, wherein the program instructions, when executed, further cause the at least one computer to:
recognize natural language design objects in the bounded sentences corresponding to predetermined names; and
replace each recognized natural language design object with a corresponding predetermined name.

10. The computer system in claim 8, wherein the program instructions, when executed, further cause the at least one computer to convert an abbreviated name and/or variations of a name in the bounded sentences to a same corresponding predetermined name.

11. The computer system in claim 8, wherein the program instructions, when executed, further cause the at least one computer to convert predetermined expressions detected in the bounded sentences into standardized expressions.

12. The computer system in claim 8, wherein the program instructions, when executed, further cause the at least one computer to identify and remove bounded sentences without verifiable properties.

13. The computer system in claim 8, wherein the program instructions, when executed, further cause the at least one computer to generate an intermediate representation model of the natural language description file that is iteratively constructed as each bounded sentence is processed.

14. The computer system in claim 13, wherein the program instructions, when executed, further cause the at least one computer to:
use the intermediate representation model to resolve ambiguities in each bounded sentence, and
use the intermediate representation model to infer relationships of the design not stated in the natural language description file.

15. The computer system in claim 8, wherein the program instructions, when executed, further cause the at least one computer to:
display one or more intermediate results from processing the natural language description file including: an intermediate representation of the natural language description file, one or more of the verification statements, one or more of the natural language design objects, one or more removed bounded sentences, or table information translated into sentences;
generate human-readable messages to assist a user in modifying the natural language description file; and
after a user modifies the natural language description file, re-process modified bounded sentences or re-translate table information into sentences.

16. The computer system in claim 15, wherein the human-readable messages include messages identifying one or more errors in processing the natural language description file to extract semantic expressions, generating the one or more intermediate representation data structures, or transforming the intermediate representation data structure.

17. The computer system in claim 2, wherein the program instructions, when executed, further cause the at least one computer to:
verify that the one or more design implementation files satisfies the one or more design verification statements using a computer-implemented design implementation verification process, and
generate a design implementation verification output for display and/or storage in memory.

18. The computer system in claim 1, wherein the program instructions, when executed, further cause the at least one computer to:
generate human-readable messages identifying the natural language design objects that are directly related to one or more design verification statements, and/or
generate human-readable messages identifying the natural language design objects that are not directly related to one or more design verification statements.

19. The computer system in claim 18, wherein a relationship between natural language design objects and design verification statements is expressed as a coverage metric.

20. A method comprising:
executing, by a processing system that includes at least one processor, instructions stored in memory to cause the processing system to:
obtain a natural language description file corresponding to a design, where the design is a hardware design or a software design;
process the natural language description file to extract semantic expressions;
generate one or more intermediate representation data structures from selected ones of the semantic expressions, where each intermediate representation data structure includes natural language design objects, natural language design object properties, and relationships between natural language design objects and/or natural language design object properties; and transform each intermediate representation data structure into one or more corresponding design verification statements derived from the natural language description file for subsequent evaluation against one or more design implementation files corresponding to the design.

21. The method in claim 20, wherein the executing instructions further cause the processing system to:
   obtain and process the one or more design implementation files corresponding to the design to determine design implementation objects included in the one or more design implementation files;
   create a mapping for each of the natural language design objects to a corresponding one of the design implementation objects;
   based on the mappings, replace the natural language design objects in the design verification statements derived from the natural language description file with the corresponding design implementation objects to produced modified verification statements derived from the natural language description file,
   wherein the subsequent evaluation includes evaluating the modified verification statements derived from the natural language description file against the one or more design implementation files.

22. The method in claim 20, wherein the natural language description file includes:
   a hardware design description that includes one or more of the following: a datasheet, a specification document, a requirements document, and user provided text; or
   a software design description that includes one or more of the following: software documentation, a specification document, a requirements document, and user provided text.

23. The method in claim 20, wherein the executing instructions further cause the at least one computer to:
   extract raw text and/or positional information from the natural language description file;
   process extracted raw text and/or extracted positional information to reconstruct layout information pertaining to a hierarchical structure of the natural language description file;
   process reconstructed layout information to generate one or more of the following: table information, figure information, header information, footer information, sentences, and paragraphs; and
   translate the table information into sentences for processing to extract semantic expressions.

24. The method in claim 23, wherein the executing instructions further cause the at least one computer to image process the figure information to generate verification statements derived from the figure information.

25. The method in claim 20, wherein the executing instructions further cause the at least one computer to:
   extract raw text from the natural language description file;
   determine boundaries of sentences in the raw text to produce bounded sentences;
   convert each of multiple words in each bounded sentence into a corresponding word identifier using a first mapping;
   group a plurality of word identifiers into a corresponding token using a second mapping;
   group a plurality of tokens into a corresponding frame by identifying predetermined frame patterns using a third mapping; and
   form semantic expressions from sets of frames.

26. The method in claim 25, wherein the executing instructions further cause the at least one computer to generate an intermediate representation model of the natural language description file that is iteratively constructed as each bounded sentence is processed.

27. The method in claim 26, wherein the executing instructions further cause the at least one computer to:
   use the intermediate representation model to resolve ambiguities in each bounded sentence, and
   use the intermediate representation model to infer relationships of the design not stated in the natural language description file.

28. The method in claim 20, wherein the executing instructions further cause the processing system to:
   verify that the one or more design implementation files satisfies the one or more design verification statements using a computer-implemented design implementation verification process, and
   generate a design implementation verification output for display and/or storage in memory.

29. A non-transitory, computer-readable storage medium encoded with instructions that, when executed by at least one hardware processor, cause the at least one hardware processor to:
   obtain a natural language description file corresponding to a design, where the design is a hardware design or a software design;
   process the natural language description file to extract semantic expressions;
   generate one or more intermediate representation data structures from selected ones of the semantic expressions, where each intermediate representation data structure includes natural language design objects, natural language design object properties, and relationships between natural language design objects and/or natural language design object properties; and
   transform each intermediate representation data structure into one or more corresponding design verification statements derived from the natural language description file for subsequent evaluation against one or more design implementation files corresponding to the design.

30. A computer system for design verification, comprising:
   at least one computer including at least one hardware processor; and
   storage to store instructions executable in the at least one computer that, when executed by the at least one hardware processor, cause the at least one computer to:
   provide a computer user interface that allows a user to create a natural language description file corresponding to a design, where the design is a hardware design or a software design;
   process the natural language description file to extract semantic expressions as the user adds user-provided text to the natural language description file through the computer user interface;
   generate one or more intermediate representation data structures from selected ones of the semantic expressions, where each intermediate representation data structure includes natural language design objects, natural language design object properties, and relationships between natural language design objects and/or natural language design object properties;
   transform each intermediate representation data structure into one or more corresponding design verification statements derived from the natural language description file for subsequent evaluation against one or more design implementation files corresponding to the design;

display one or more intermediate results from processing the natural language description file including: an intermediate representation of the natural language description file, one or more of the design verification statements, one or more of the natural language design objects; and generate and display human-readable messages to assist the user in modifying the natural language description file.

31. The computer system in claim 30, wherein the messages include messages identifying one or more errors in processing the natural language description file to extract semantic expressions, generating the one or more intermediate representation data structures, or transforming the intermediate representation data structure.

32. The computer system in claim 30, wherein the messages include messages identifying the natural language design objects that are directly related to one or more design verification statements, and/or
wherein the messages include messages identifying the natural language design objects that are not directly related to one or more design verification statements.

33. The computer system in claim 30, wherein a relationship between natural language design objects and design verification statements is expressed as a coverage metric.

34. The computer system in claim 30, wherein the instructions, when executed, further cause the at least one computer to:

obtain and process the one or more design implementation files corresponding to the design to determine design implementation objects included in the one or more design implementation files;

create a mapping for each of the natural language design objects to a corresponding one of the design implementation objects;

based on the mappings, replace the natural language design objects in the design verification statements derived from the natural language description file with the corresponding design implementation objects to produced modified verification statements derived from the natural language description file, wherein the subsequent evaluation includes evaluating the modified verification statements derived from the natural language description file against the one or more design implementation files, and wherein the messages include results from the subsequent evaluation, and wherein the instructions, when executed, further cause the at least one computer to:

verify that the one or more design implementation files satisfies the one or more design verification statements using a computer-implemented design implementation verification process, and generate a design implementation verification output for display and/or storage in memory.

35. The computer system in claim 34, wherein the instructions, when executed, further cause the at least one computer to:

based on processing the natural language description file, display one or more mappings between natural language design objects and design implementation objects, and allow a user to modify the one or more mappings between natural language design objects and design implementation objects.

36. The computer system in claim 30, wherein the instructions, when executed, further cause the at least one computer to:

allow the user to add tables and figures to a created natural language description file;

extract layout information pertaining to a hierarchical structure of the created natural language description file;

process the layout information to generate one or more of the following: table information, figure information, header information, footer information, sentences, and paragraphs; and translate the table information into sentences.

37. The computer system in claim 36, wherein the instructions, when executed, further cause the at least one computer to image process the figure information to generate verification statements derived from the figure information.

38. The computer system in claim 30, wherein the instructions, when executed, further cause the at least one computer to:

determine boundaries of sentences in the user-provided text to produce bounded sentences;

convert each of multiple words in each bounded sentence into a corresponding word identifier using a first mapping;

group a plurality of word identifiers into a corresponding token using a second mapping;

group a plurality of tokens into a corresponding frame by identifying predetermined frame patterns using a third mapping; and form semantic expressions from sets of frames.

39. The computer system in claim 38, wherein the instructions, when executed, further cause the at least one computer to:

recognize natural language design objects in the bounded sentences corresponding to predetermined names; and replace each recognized natural language design object with a corresponding predetermined name.

40. The computer system in claim 38, wherein the instructions, when executed, further cause the at least one computer to convert an abbreviated name and/or variations of a name in the bounded sentences to a same corresponding predetermined name.

41. The computer system in claim 38, wherein the instructions, when executed, further cause the at least one computer to convert predetermined expressions detected in the bounded sentences into standardized expressions.

42. The computer system in claim 38, wherein the instructions, when executed, further cause the at least one computer to identify and remove bounded sentences without verifiable properties.

43. The computer system in claim 38, wherein the instructions, when executed, further cause the at least one computer to generate an intermediate representation model of the natural language description file that is iteratively constructed as each bounded sentence is processed.

44. The computer system in claim 43, wherein the instructions, when executed, further cause the at least one computer to:

use the intermediate representation model to resolve ambiguities in each bounded sentence, and use the intermediate representation model to infer relationships of the design not stated in the natural language description file.

45. A method comprising:
executing, by a processing system that includes at least one processor, instructions stored in memory to cause the processing system to:
provide a computer user interface that allows a user to create the natural language description file corresponding to a design, where the design is a hardware design or a software design;
process the natural language description file to extract semantic expressions as the user adds user-provided text to the natural language description file through the computer user interface;
generate one or more intermediate representation data structures from selected ones of the semantic expressions, where each intermediate representation data structure includes natural language design objects, natural language design object properties, and relationships between natural language design objects and/or natural language design object properties;
transform each intermediate representation data structure into one or more corresponding design verification statements derived from the natural language description file for subsequent evaluation against one or more design implementation files corresponding to the design;
display one or more intermediate results from processing the natural language description file including: an intermediate representation of the natural language description file, one or more of the design verification statements, one or more of the natural language design objects; and
generate and display human-readable messages to assist the user in modifying the natural language description file.

46. The method in claim 45, wherein the executing instructions further cause the processing system to:
obtain and process the one or more design implementation files corresponding to the design to determine design implementation objects included in the one or more design implementation files;
create a mapping for each of the natural language design objects to a corresponding one of the design implementation objects;
based on the mappings, replace the natural language design objects in the design verification statements derived from the natural language description file with the corresponding design implementation objects to produced modified verification statements derived from the natural language description file,
wherein the subsequent evaluation includes evaluating the modified verification statements derived from the natural language description file against the one or more design implementation files, and
wherein the messages include results from the subsequent evaluation, and
wherein the executed instructions further cause the at least one computer to:
verify that the one or more design implementation files satisfies the one or more design verification statements using a computer-implemented design implementation verification process, and
generate a design implementation verification output for display and/or storage in memory.

47. The method in claim 45, wherein the executing instructions further cause the at least one computer to:
allow the user to add tables and figures to a created natural language description file;
extract layout information pertaining to a hierarchical structure of the created natural language description file;
process the layout information to generate one or more of the following: table information, figure information, header information, footer information, sentences, and paragraphs; and
translate the table information into sentences.

48. The method in claim 47, wherein the executing instructions further cause the at least one computer to image process the figure information to generate verification statements derived from the figure information.

49. The method in claim 45, wherein the executing instructions further cause the processing system to:
determine boundaries of sentences in the user-provided text to produce bounded sentences;
convert each of multiple words in each bounded sentence into a corresponding word identifier using a first mapping;
group a plurality of word identifiers into a corresponding token using a second mapping;
group a plurality of tokens into a corresponding frame by identifying predetermined frame patterns using a third mapping; and
form semantic expressions from sets of frames.

50. The method in claim 49, wherein the executing instructions further cause the processing system to generate an intermediate representation model of the natural language description file that is iteratively constructed as each bounded sentence is processed.

51. The method in claim 50, wherein the executing instructions further cause the at least one computer to:
use the intermediate representation model to resolve ambiguities in each bounded sentence, and
use the intermediate representation model to infer relationships of the design not stated in the natural language description file.

52. A non-transitory, computer-readable storage medium encoded with instructions that, when executed by at least one hardware processor, cause the at least one hardware processor to:
provide a computer user interface that allows a user to create the natural language description file corresponding to a design, where the design is a hardware design or a software design;
process the natural language description file to extract semantic expressions as the user adds user-provided text to the natural language description file through the computer user interface;
generate one or more intermediate representation data structures from selected ones of the semantic expressions, where each intermediate representation data structure includes natural language design objects, natural language design object properties, and relationships between natural language design objects and/or natural language design object properties;
transform each intermediate representation data structure into one or more corresponding design verification statements derived from the natural language description file for subsequent evaluation against one or more design implementation files corresponding to the design;
display one or more intermediate results from processing the natural language description file including: an intermediate representation of the natural language description file, one or more of the design verification statements, one or more of the natural language design objects; and generate and display human-readable messages to assist the user in modifying the natural language description file.

\* \* \* \* \*